US011302670B2

(12) United States Patent
Nakamura

(10) Patent No.: US 11,302,670 B2
(45) Date of Patent: Apr. 12, 2022

(54) SEMICONDUCTOR DEVICE INCLUDING CONDUCTIVE POST WITH OFFSET

(71) Applicant: FUJI ELECTRIC CO., LTD., Kawasaki (JP)

(72) Inventor: Yoko Nakamura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/889,223

(22) Filed: Jun. 1, 2020

(65) Prior Publication Data
US 2021/0020604 A1 Jan. 21, 2021

(30) Foreign Application Priority Data
Jul. 19, 2019 (JP) .............................. JP2019-133379

(51) Int. Cl.
*H01L 25/065* (2006.01)
*H01L 23/538* (2006.01)
*H01L 23/00* (2006.01)
*H01L 23/31* (2006.01)

(52) U.S. Cl.
CPC ...... *H01L 25/0655* (2013.01); *H01L 23/3121* (2013.01); *H01L 23/5385* (2013.01); *H01L 24/16* (2013.01); *H01L 2224/16225* (2013.01)

(58) Field of Classification Search
CPC combination set(s) only.
See application file for complete search history.

(56) References Cited

U.S. PATENT DOCUMENTS

| 10,242,961 | B2 | 3/2019 | Hinata | |
| 2015/0380374 | A1* | 12/2015 | Nakamura | H01L 25/18 |
| | | | | 361/783 |
| 2016/0126209 | A1 | 5/2016 | Hinata | |
| 2017/0018524 | A1* | 1/2017 | Nashida | H01L 24/16 |
| 2017/0365547 | A1* | 12/2017 | Nakamura | H01L 23/49844 |
| 2018/0174987 | A1* | 6/2018 | Chounabayashi | H01L 24/01 |

FOREIGN PATENT DOCUMENTS

| JP | 200964852 A | 3/2009 |
| JP | 201692233 A | 5/2016 |
| JP | 2016207860 A | 12/2016 |
| JP | 2017224736 A | 12/2017 |
| JP | 201874088 A | 5/2018 |

* cited by examiner

*Primary Examiner* — Douglas W Owens
(74) *Attorney, Agent, or Firm* — Staas & Halsey LLP

(57) ABSTRACT

A semiconductor device including: an insulating circuit substrate including a principal surface and a back surface; semiconductor chips each including an electrode on a principal surface and having a back surface on an opposite side to the principal surface, the back surface being fixed to the principal surface of the insulating circuit substrate; a wiring substrate facing the principal surface side of the insulating circuit substrate, separated from the semiconductor chip; a conductive post fixed to the electrode of the semiconductor chips and the wiring substrate; and a resin sealing body sealing the insulating circuit substrate, the semiconductor chips, the wiring substrate, and the conductive posts in such a manner as to expose the back surface of the insulating circuit substrate, wherein the semiconductor chips are respectively arranged on sides on which two short sides are located, and the conductive post has a recessed portion on its peripheral surface.

7 Claims, 17 Drawing Sheets

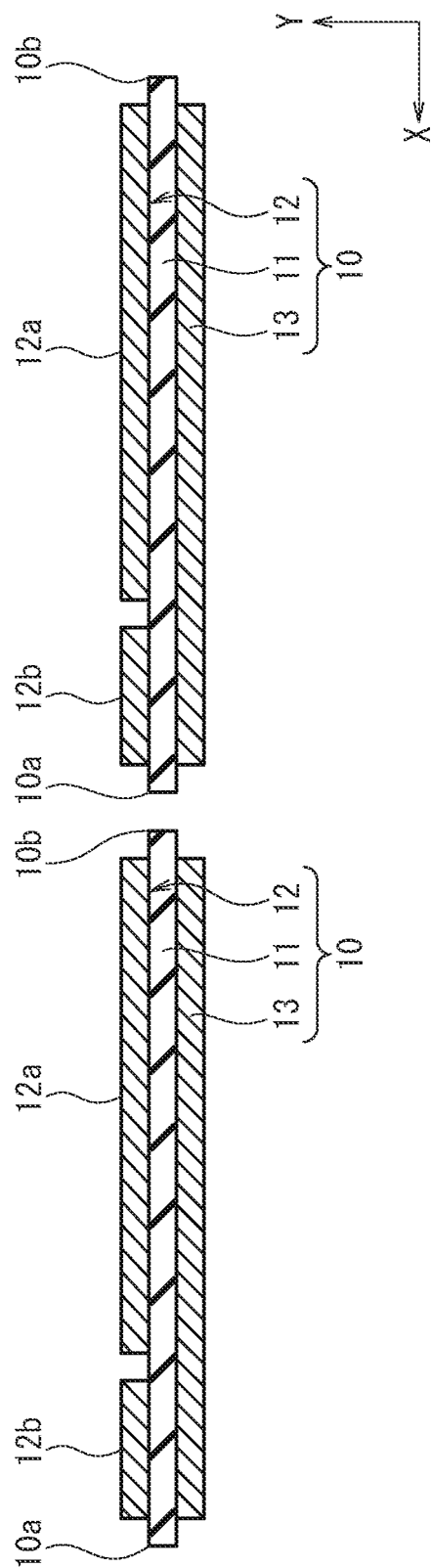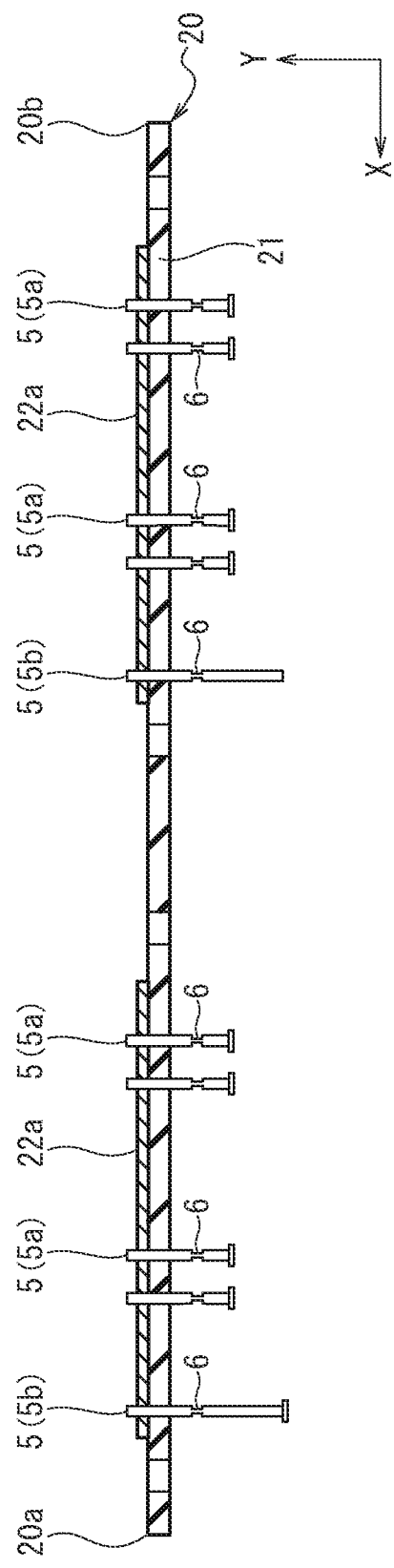

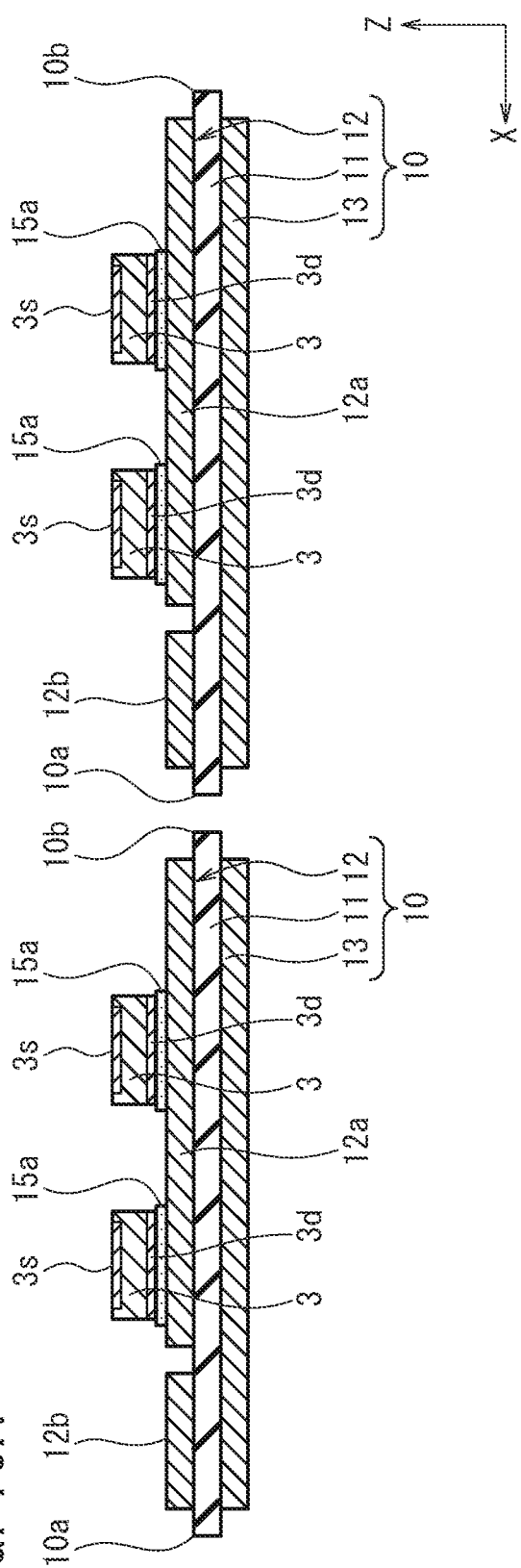
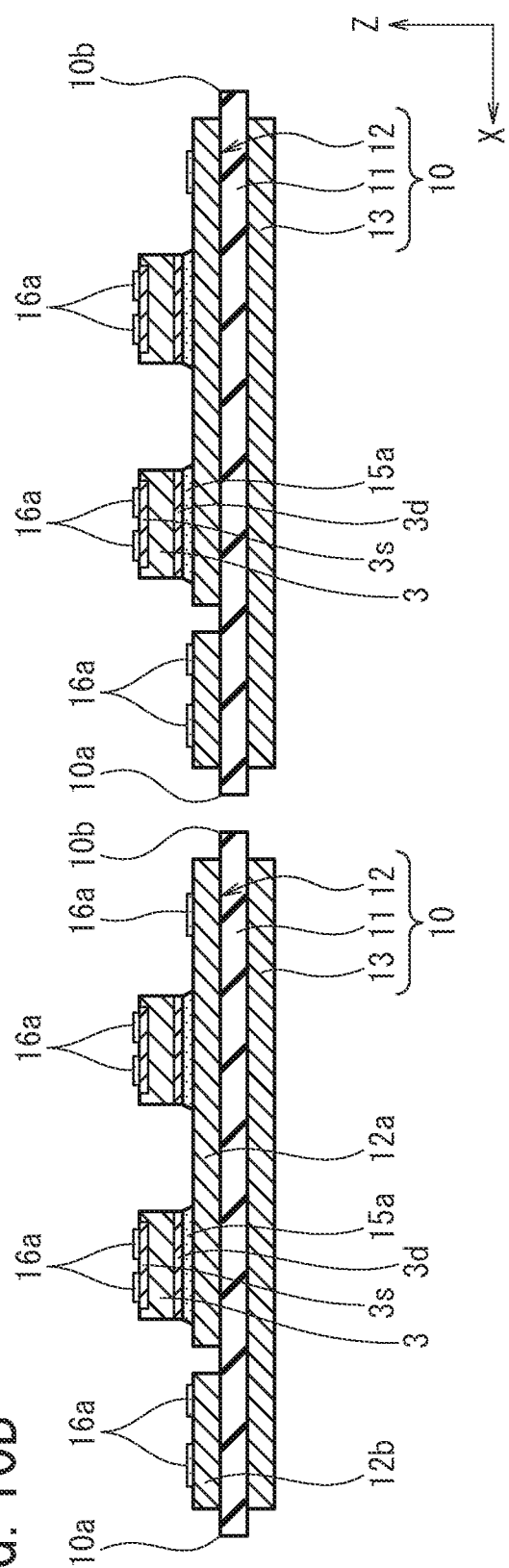

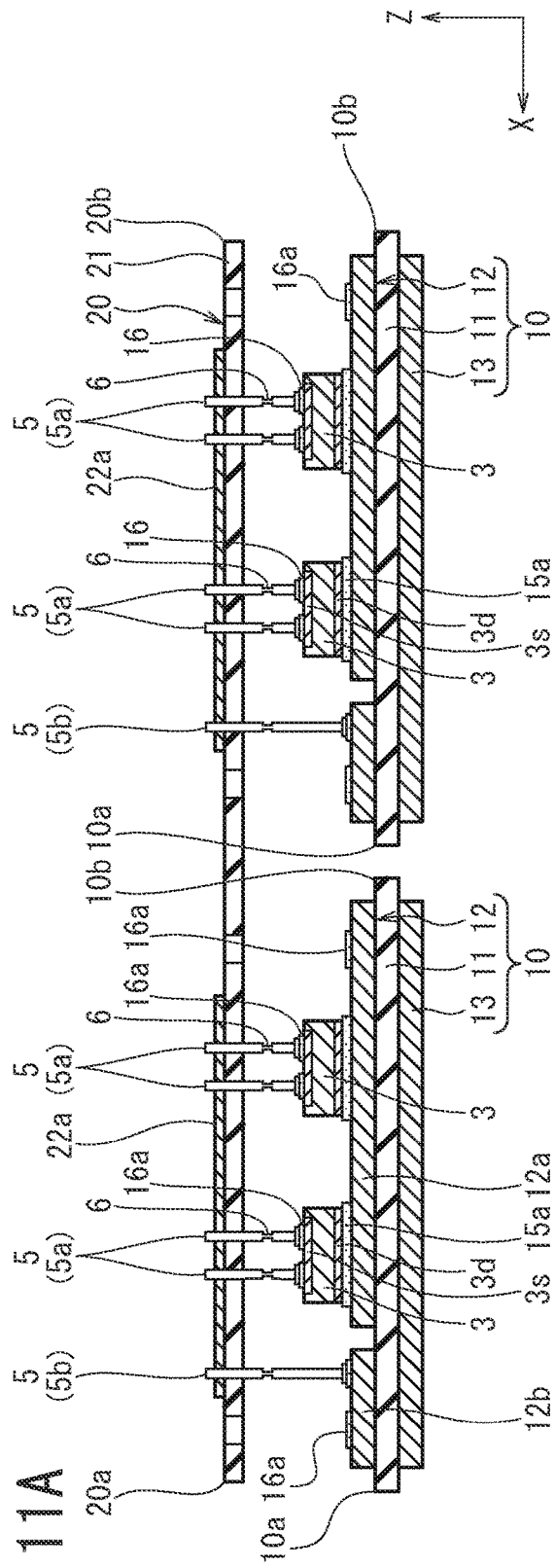

SEMICONDUCTOR DEVICE INCLUDING CONDUCTIVE POST WITH OFFSET

CROSS REFERENCE TO RELATED APPLICATIONS AND INCORPORATION BY REFERENCE

This application claims benefit of priority under 35 USC 119 based on Japanese Patent Application No. 2019-133379 filed on Jul. 19, 2019, the entire contents of which are incorporated by reference herein.

TECHNICAL FIELD

The present invention relates to a semiconductor device and particularly relates to a technology that is effective when applied to a semiconductor device including a wiring substrate supported to an insulating circuit substrate byway of conductive posts.

BACKGROUND ART

As semiconductor devices used for power converters, it is known that semiconductor devices in each of which, as described in JP 2009-064852 A, for example, a plurality of semiconductor chips which are mounted on an insulating circuit substrate, are electrically interconnected via conductive posts and a wiring substrate. In a semiconductor device of this type, an insulating circuit substrate, semiconductor chips, conductive posts, and a wiring substrate are sealed by a resin sealing body.

The citation list below includes the following literatures other than JP 2009-064852 A.

In JP 2016-207860 A, a lead frame for semiconductor device including a substrate and circuit portions is disclosed. A technology for preventing an abrasion or a crack from occurring to a resin member by disposing recessed portions on side surfaces of the respective ones of terminal portions and mounting terminal portions constituting the circuit portions is disclosed.

In JP 2017-224736 A, a technology for, by disposing, on conductive posts, longitudinal grooves for absorbing solder connecting electrodes of a semiconductor chip and the conductive posts, preventing solder from reaching a wiring substrate is disclosed.

In JP 2016-092233 A, a technology for, by disposing longitudinal grooves on conductive posts, preventing solder fillets of conductive posts adjacent to each other from coming into contact with each other is disclosed.

In JP 2018-074088 A, a technology for, using a conductive post a portion of which is narrow, adjusting gate resistance is disclosed.

SUMMARY OF INVENTION

For power semiconductor devices, a transfer molding method is used for molding resin sealing bodies thereof. Specifically, a resin sealing body is molded by setting a substrate stack in which a wiring substrate is supported to an insulating circuit substrate by way of conductive posts in the cavity of a molding die and pressure injecting thermosetting resin inside the cavity. By pressure injecting resin with the back surface of the insulating circuit substrate in pressure contact with a wall surface of the cavity of the molding die, the back surface of the insulating circuit substrate is exposed from the back surface of the resin sealing body. After the resin sealing body is taken out of the molding die, resin burrs attached to the back surface of the insulating circuit substrate are removed by grinding or the like.

However, a substrate stack sometimes warps greatly in a direction in which the back surface of the insulating circuit substrate protrudes to form a protruding surface. When a substrate stack having a large warp of this kind is set in the cavity of the molding die, a gap is generated between the back surface of the insulating circuit substrate and the wall surface of the cavity of the molding die. When resin is pressure injected in to the cavity while the generated gap is not eliminated, resin burrs attached on the back surface of the insulating circuit substrate is formed thick and it thus becomes difficult to remove the resin burrs by means of grinding or the like, which causes an assembly failure. Since such an assembly failure means a reduction in manufacturing yield of semiconductor devices, there has been room for improvement from a viewpoint of improvement in manufacturing yield.

Accordingly, the inventors have made the invention, focusing on conductive posts.

An object of the invention is to provide a technology capable of achieving improvement in manufacturing yield of semiconductor devices.

According to an aspect of the present invention, there is provided a semiconductor device including: an insulating circuit substrate including a principal surface and a back surface located on opposite sides to each other and having a plan-view shape of a rectangle; semiconductor chips each of which includes an electrode on a principal surface and has a back surface on an opposite side to the principal surface, the back surface being fixed to the principal surface of the insulating circuit substrate; a wiring substrate arranged facing the principal surface side of the insulating circuit substrate, separated from the semiconductor chip; a conductive post having one end side fixed to the electrode of the semiconductor chips via a joining material and another end side fixed to the wiring substrate; and a resin sealing body configured to seal the insulating circuit substrate, the semiconductor chips, the wiring substrate, and the conductive posts in such a manner as to expose the back surface of the insulating circuit substrate, wherein the semiconductor chips are respectively arranged on sides on which two sides located on opposite sides to each other in a longitudinal direction of the insulating circuit substrate are located, and the conductive post has a recessed portion recessed from an outer peripheral surface toward an inner side.

According to the present invention, improvement in manufacturing yield of semiconductor devices is achieved.

BRIEF DESCRIPTION OF DRAWINGS

FIGS. 9A and 9B are schematic cross-sectional views for a description of a method for manufacturing the semiconductor device according to the first embodiment of the invention;

FIGS. 10A and 10B are other schematic cross-sectional views for a description of the method for manufacturing the semiconductor device according to the first embodiment of the invention;

FIGS. 11A and 11B are still other schematic cross-sectional views for a description of the method for manufacturing the semiconductor device according to the first embodiment of the invention;

DESCRIPTION OF EMBODIMENTS

Figure 1:
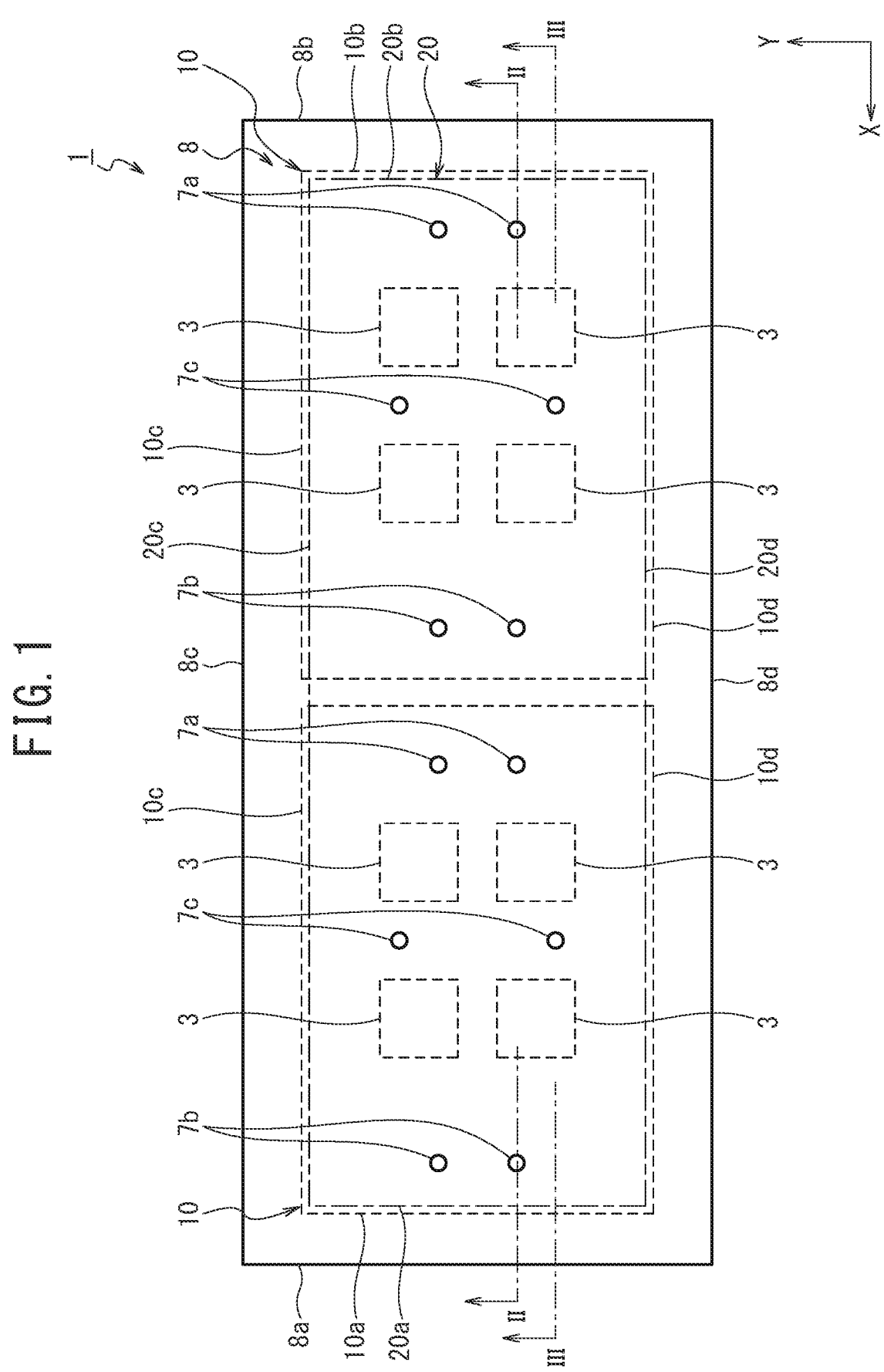
FIG. 1 is a schematic plan view illustrative of an example of an external appearance configuration of a semiconductor device according to a first embodiment of the invention.

Hereinafter, embodiments of the invention will be described in detail with reference to the drawings.

Note that, in all the drawings for a description of examples of the invention, the same signs are assigned to the constituent components having the same functions and a repeated description thereof will be omitted.

In addition, the respective drawings are schematic and do not necessarily depict the actual dimensions or precise configurations of practical implementation of the invention. Moreover, the following embodiments indicate devices and methods to embody the technical idea of the invention by way of example and do not limit the configuration to those described below. That is, the technical idea of the invention can be subjected to a variety of alterations within the technical scope prescribed in CLAIMS.

Furthermore, in the following embodiments, it is assumed that, among three directions orthogonal to one another in space, a first direction and a second direction that are orthogonal to each other in the same plane are the X-direction and the Y-direction, respectively, and a third direction that is orthogonal to both the first direction and the second direction is the Z-direction.

In the description of the invention, a "main electrode" means one electrode of the emitter electrode and the collector electrode in an insulated gate bipolar transistor (IGBT). In a field effect transistor (FET) or a static induction transistor (SIT), a main electrode means one electrode of the source electrode and the drain electrode. More specifically, when the above-described "one electrode" is defined as a "first main electrode", "the other electrode" is a "second main electrode". That is, a "second main electrode" means one electrode of the emitter electrode and the collector electrode that does not serve as the first main electrode in an IGBT and one electrode of the source electrode and the drain electrode that does not serve as the first main electrode in an FET or SIT. Since, in the following embodiments, a description will be made focusing on a vertical MISFET as a transistor element, the description will be made assuming that the first main electrode and the second main electrode are the drain electrode and the source electrode, respectively.

First Embodiment

In a first embodiment, an example in which the invention is applied to a semiconductor device that includes a substrate stack in which a wiring substrate is supported to two insulating circuit substrates by way of conductive posts will be described.

<Configuration of Semiconductor Device>

As illustrated in FIGS. 1 to 4A and 4B, a semiconductor device 1 according to the first embodiment of the invention includes a substrate stack 2 and a resin sealing body 8 configured to seal the substrate stack 2.

The substrate stack 2 includes two insulating circuit substrates 10, semiconductor chips 3 that are mounted on each of the two insulating circuit substrates 10, and a wiring substrate 20 that is arranged facing the chip mounting surface side of the respective ones of the two insulating circuit substrates 10, separated from the semiconductor chips 3. The substrate stack 2 also includes a plurality of conductive posts 5, a plurality of first main circuit terminals 7a, a plurality of second main circuit terminals 7b, and a plurality of control terminals 7c that are disposed with respect to each of the two insulating circuit substrates 10 and corresponding to the two insulating circuit substrates 10.

As illustrated in FIG. 1, the resin sealing body 8 has a plan-view shape of a rectangle and has one short side 8a and the other short side 8b that are located on the opposite sides to each other in the longitudinal direction, which is in the X-direction (first direction), and one long side 8c and the other long side 8d that are located on the opposite sides to each other in the short-side direction, which is in the Y-direction (second direction). The resin sealing body 8 also has a thickness in the Z-direction (third direction), which is orthogonal to the X-direction and the Y-direction (see FIGS. 4A and 4B). The resin sealing body 8 is formed using, for example, a transfer molding method and formed of an epoxy-based thermosetting insulating resin.

Figure 3:
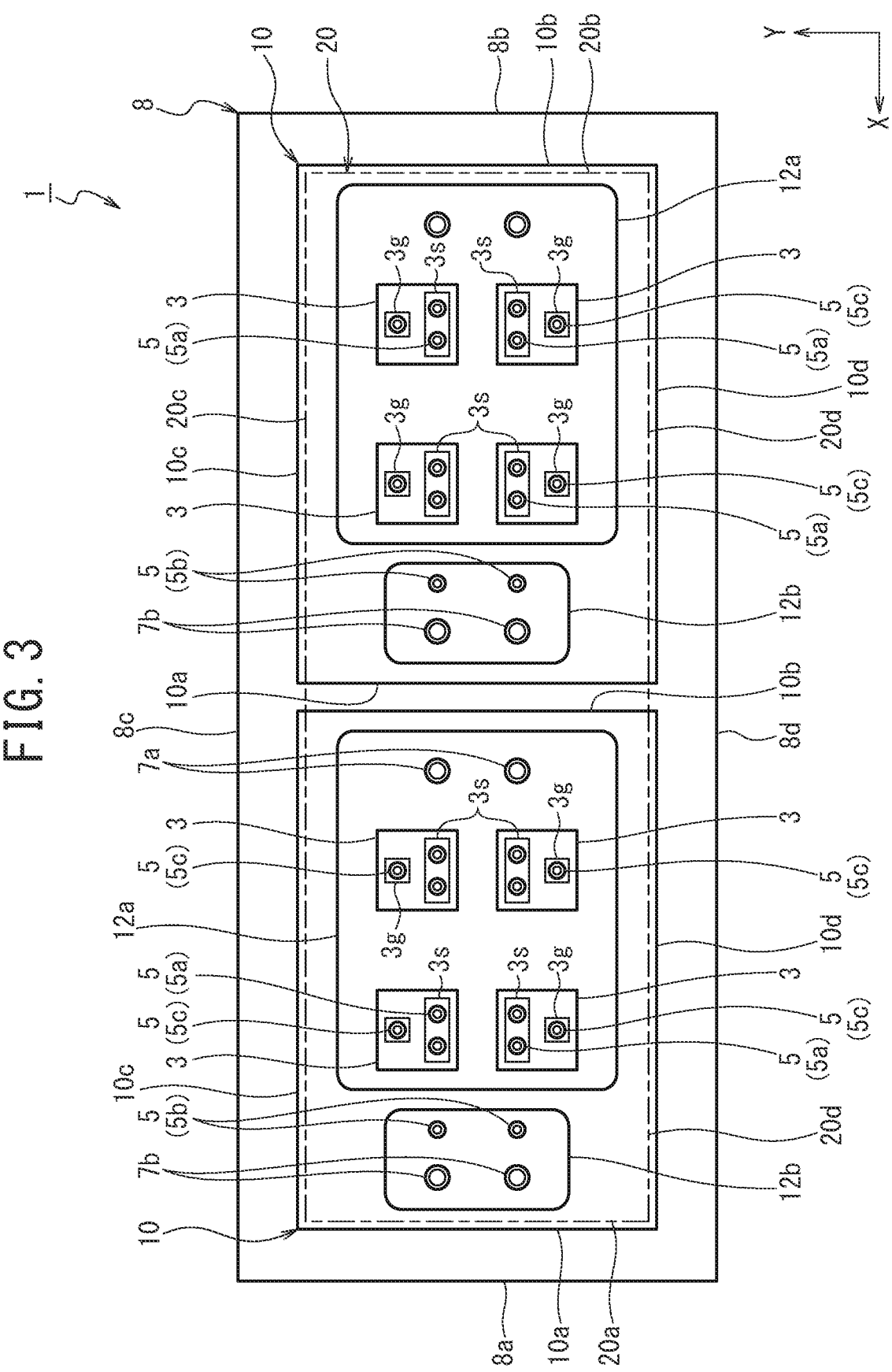
FIG. 3 is a schematic plan view illustrative of an example of an arrangement of semiconductor chips in the semiconductor device according to the first embodiment of the invention.

As illustrated in FIG. 3, each of the insulating circuit substrates 10 has a plan-view shape of, for example, a rectangle which is configured in the same structure, and has one short side 10a and the other short side 10b that are located on the opposite sides to each other in the longitudinal direction, which is in the X-direction, and one long side 10c and the other long side 10d that are located on the opposite sides to each other in the short-side direction, which is in the Y-direction. The respective ones of the two insulating circuit substrates 10 are arranged with a predetermined gap interposed therebetween in the longitudinal direction thereof in such a manner that the direction of the two short sides 10a and 10b coincides with the direction of the two short sides 8a and 8b of the resin sealing body 8 and the direction of the two long sides 10c and 10d also coincides with the direction of the two long sides 8c and 8d of the resin sealing body 8. In addition, the respective ones of the two insulating circuit substrates 10 are arranged with a predetermined gap interposed therebetween in the longitudinal direction thereof in such a manner that the other short side 10b of the two short sides 10a and 10b of one insulating circuit substrate 10 and the one short side 10a of the two short sides 10a and 10b of the other insulating circuit substrate 10 face each other.

In the configuration, the four sides (the short sides 10a and 10b and the long sides 10c and 10d) of each of the two insulating circuit substrates 10 correspond to the four sides of an insulating plate 11, which will be described later.

Figure 4A:
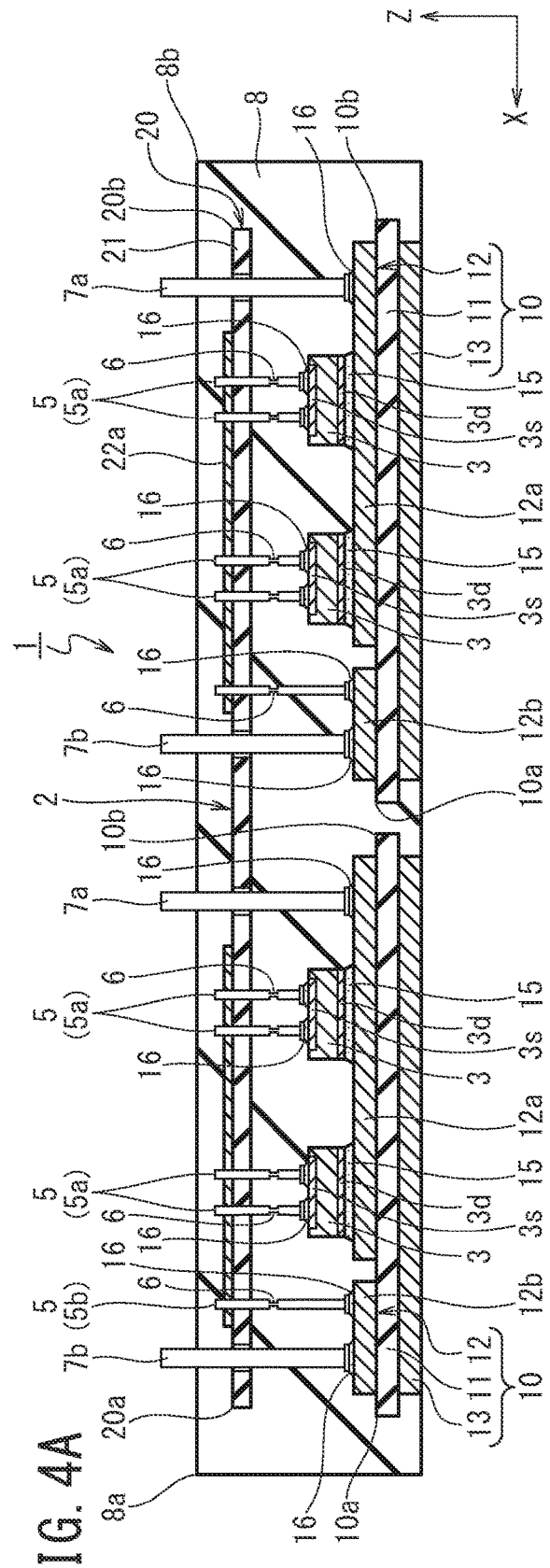
FIG. 4A is a schematic cross-sectional view illustrative of a cross-sectional structure taken at the line II-II of FIG. 1 to illustrate an example of an internal structure of the semiconductor device according to the first embodiment of the invention.
Figure 4B:
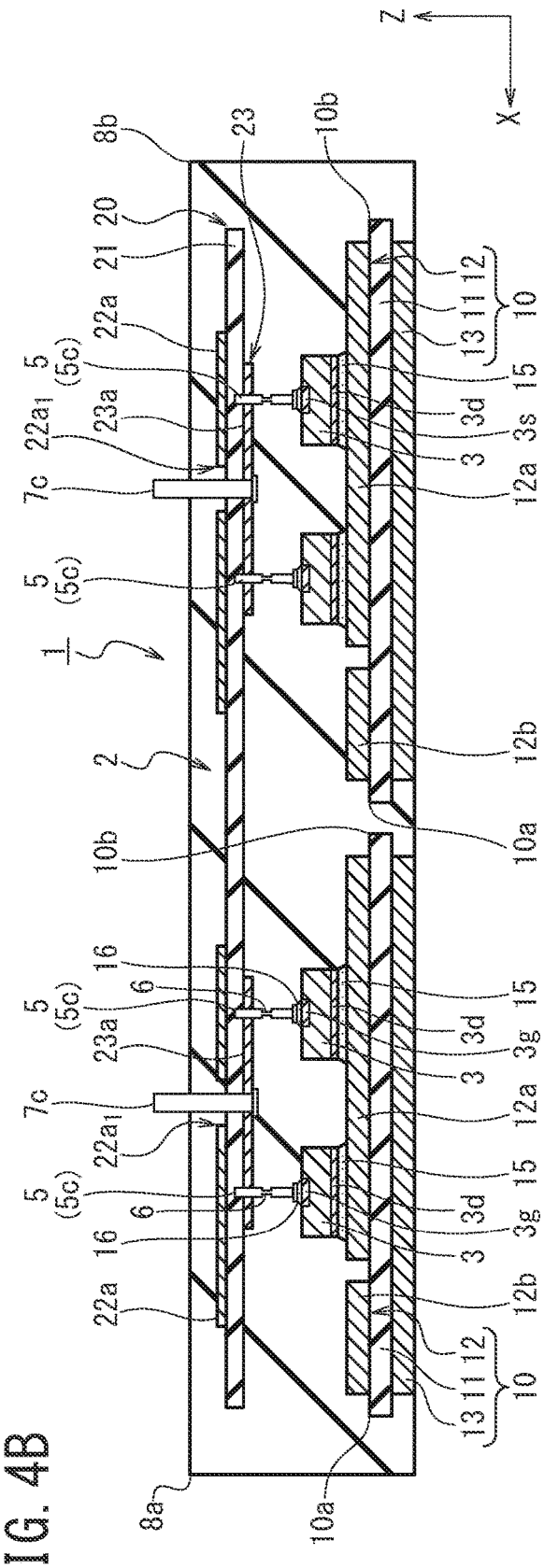
FIG. 4B is a schematic cross-sectional view illustrative of a cross-sectional structure taken at the line III-III of FIG. 1 to illustrate an example of an internal structure of the semiconductor device according to the first embodiment of the invention.
Figure 5:
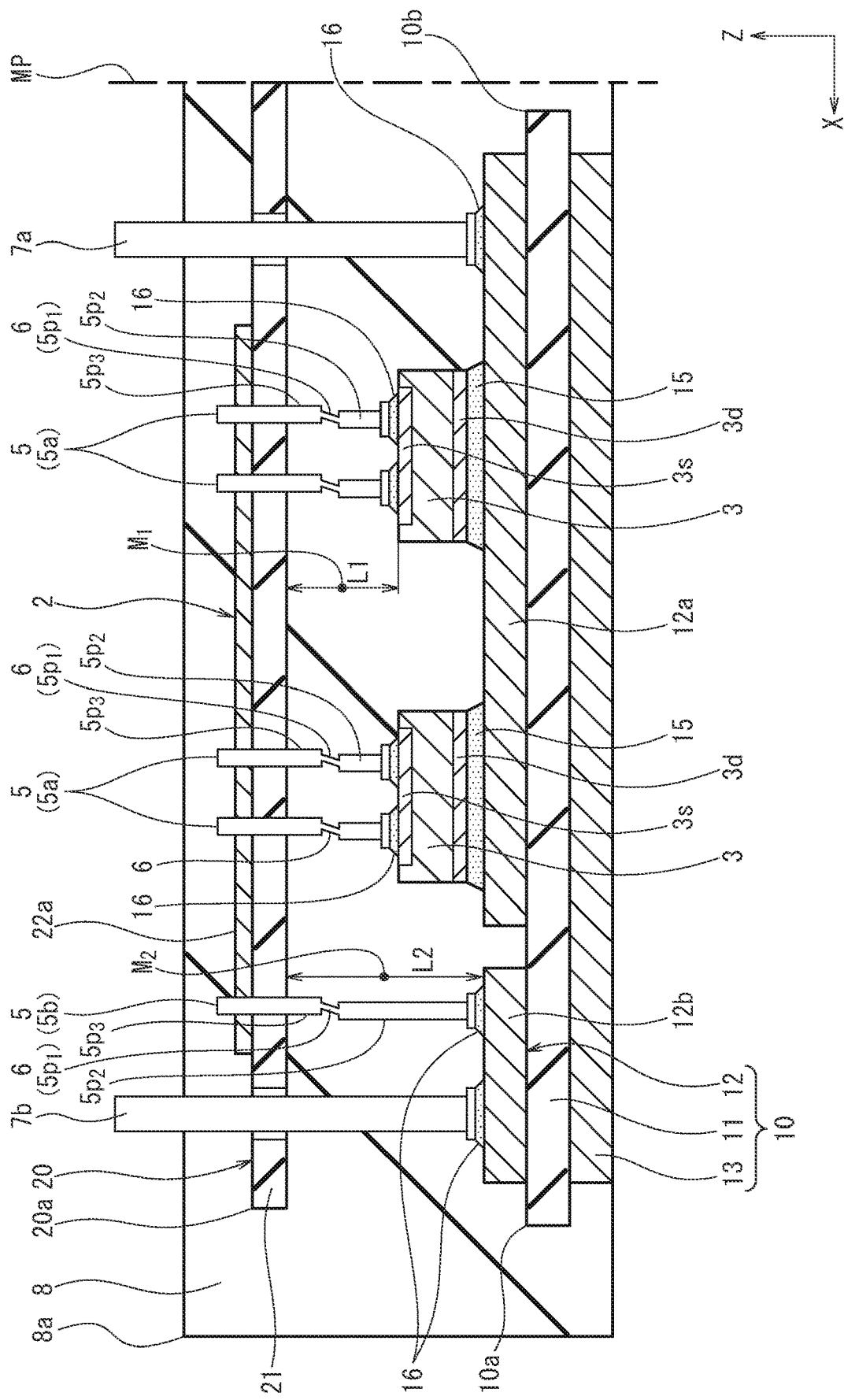
FIG. 5 is a main part schematic cross-sectional view illustrative of a left half of FIG. 4A in an enlarged manner.
Figure 6:
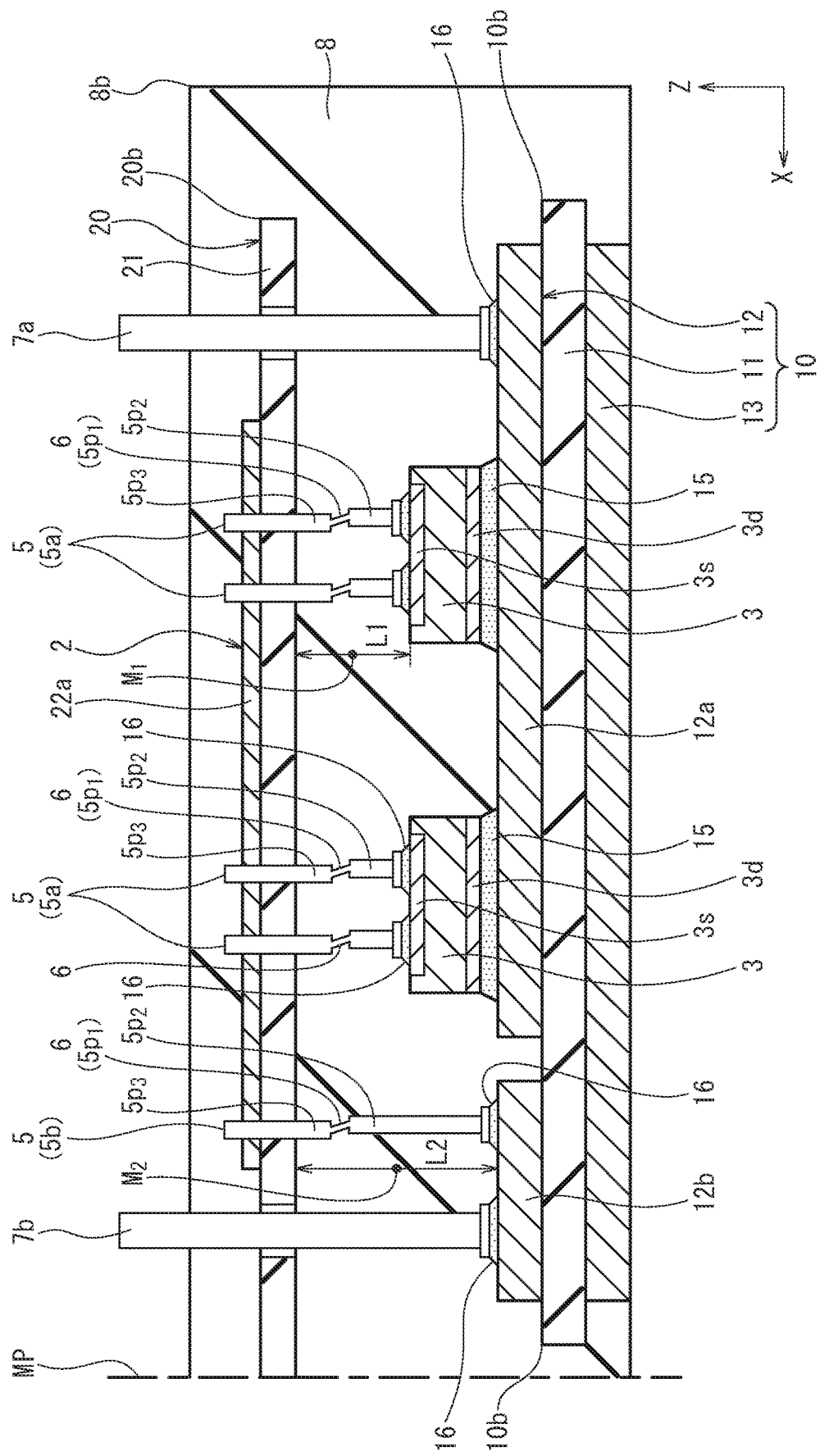
FIG. 6 is a main part schematic cross-sectional view illustrative of a right half of FIG. 4A in an enlarged manner.
Figure 7:
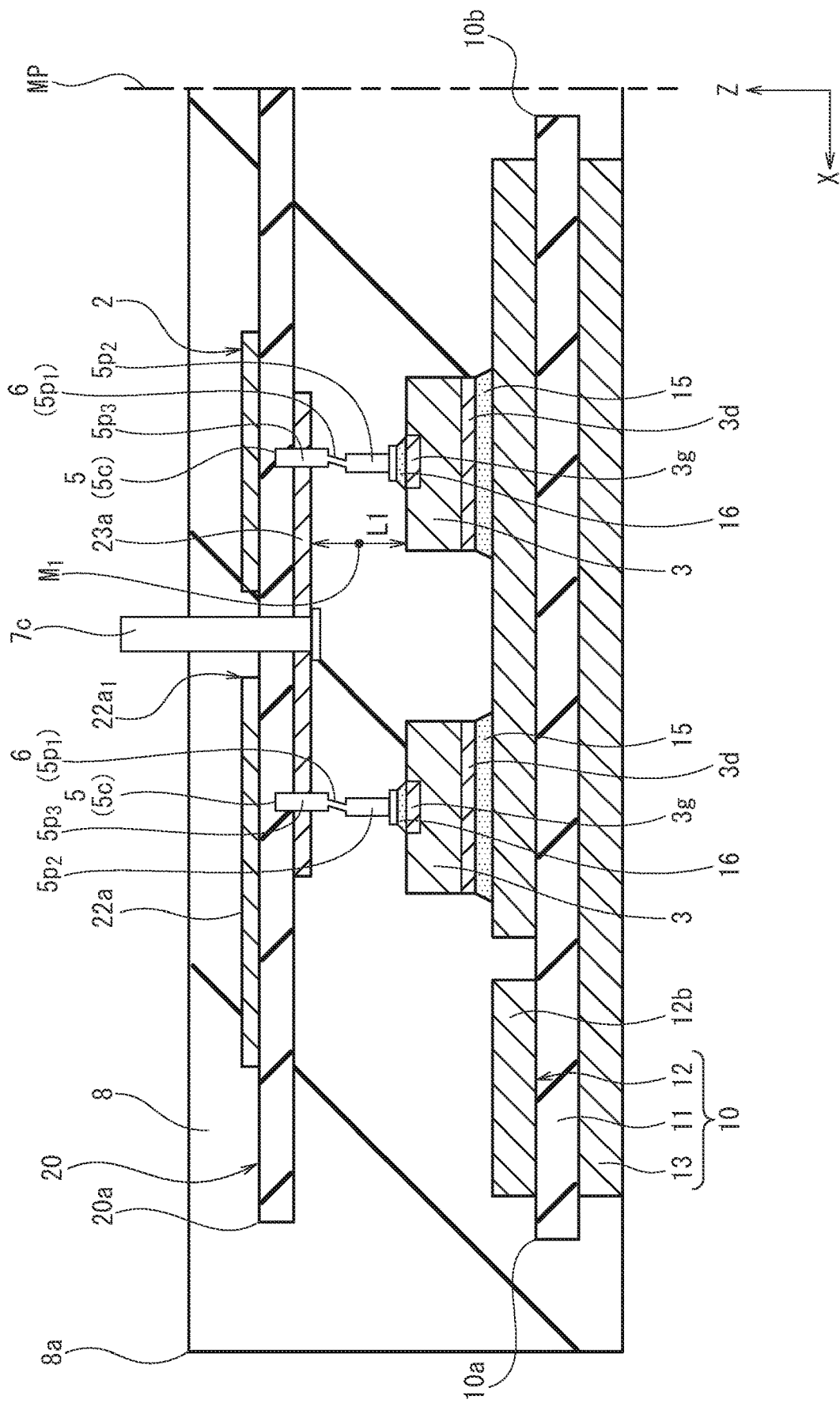
FIG. 7 is a main part schematic cross-sectional view illustrative of a left half of FIG. 4B in an enlarged manner.
Figure 8:
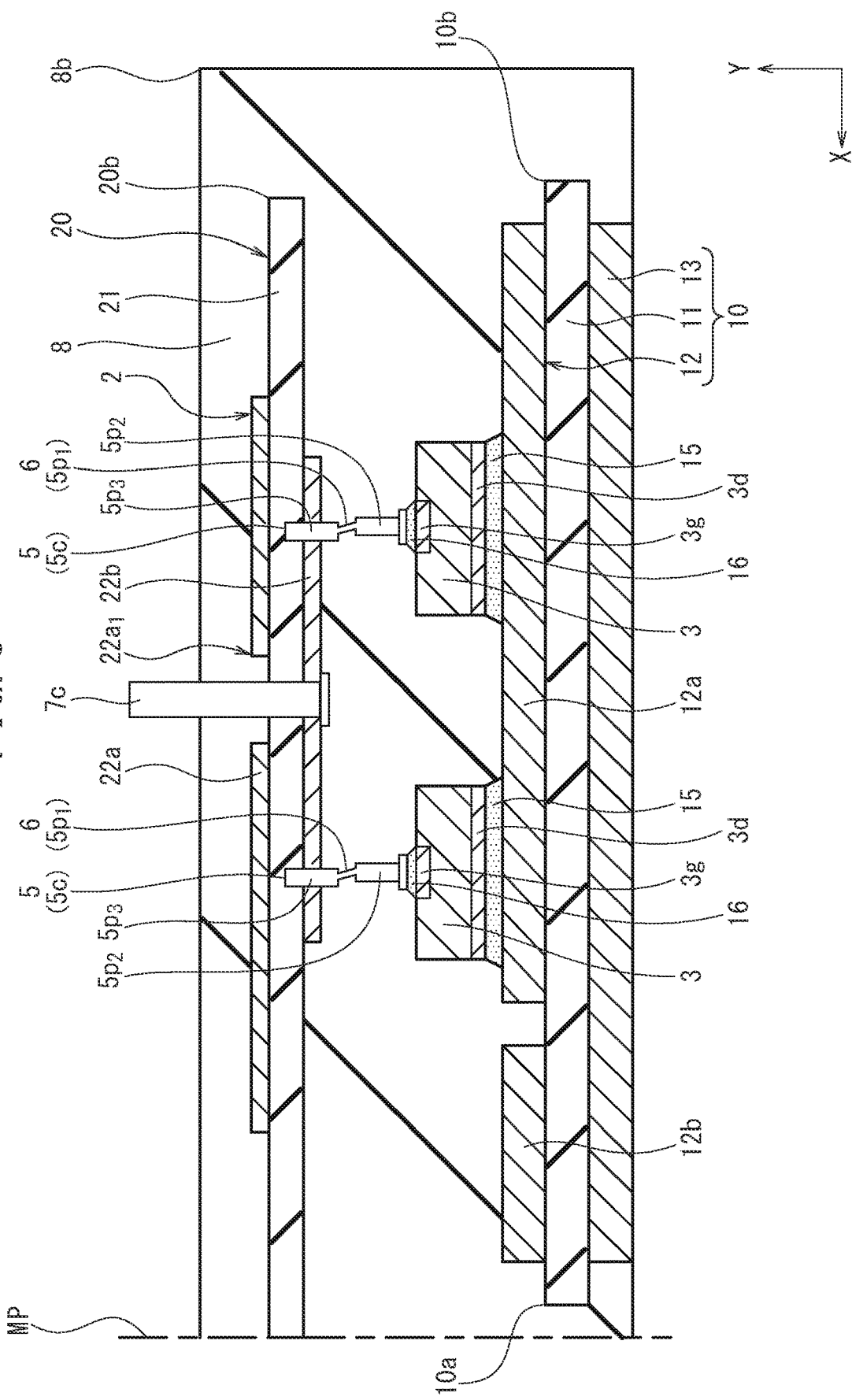
FIG. 8 is a main part schematic cross-sectional view illustrative of a right half of FIG. 4B in an enlarged manner.
Figure 12:
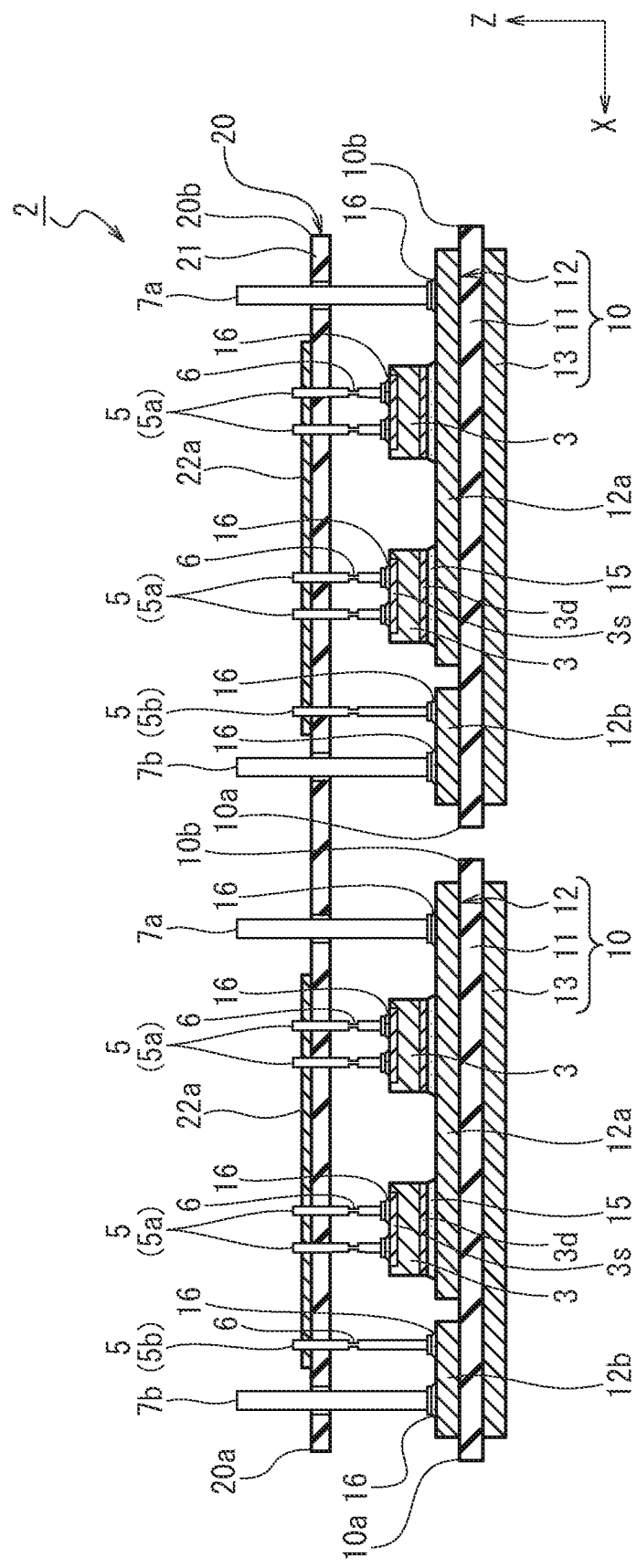
FIG. 12 is still another schematic cross-sectional view for a description of the method for manufacturing the semiconductor device according to the first embodiment of the invention.

As illustrated in FIGS. 4A and 4B, each of the two insulating circuit substrates 10 includes an insulating plate 11, conductive plates 12 that are fixed on the principal surface of the insulating plate 11, and a heat radiation plate 13 that is fixed on the back surface of the insulating plate 11 on the opposite side to the principal surface thereof. In the first embodiment, the conductive plates 12 have a configuration including a first conductive plate 12a and a second conductive plate 12b that are separated from each other in an insulating manner. For each of the two insulating circuit substrate 10, a direct copper bonding (DCB) substrate in which copper is bonded on the principal surface and back surface of, for example, a ceramic substrate through eutectic bonding, an active metal brazing (AMB) substrate in which a metal is arranged on the principal surface and back surface of a ceramic substrate by an AMB method, or the like can be employed. As a material of a ceramic substrate, for example, silicon nitride ($Si_3N_4$), aluminum nitride (AlN), or alumina ($Al_2O_3$) can be employed. In the first embodiment, for example, copper (Cu), which excels in electrical conductivity and thermal conductivity, is used as metal materials of the conductive plates 12 and the heat radiation plates 13.

As illustrated in FIG. 3, each of the insulating plates 11 has a plan-view shape of, for example, a rectangle and has the extending direction of two short sides located on the opposite sides to each other in the longitudinal direction, which is in the X-direction, coinciding with the extending direction of the two short sides 8a and 8b of the resin sealing body 8 and the extending direction of two long sides located on the opposite sides to each other in the short-side direction, which is in the Y-direction, also coinciding with the extending direction of the two long sides 8c and 8d of the resin sealing body 8. The two short sides and two long sides of each of the insulating plates 11 serve as the two short sides 10a and 10b and two long sides 10c and 10d of one of the above-described insulating circuit substrates 10, respectively.

As illustrated in FIG. 3, each first conductive plate 12a is formed into a solid pattern of which the plan-view shape is, for example, a rectangle and is arranged at a position biased toward the side on which the other short side of the two short sides of an insulating plate 11 is located (the side on which the other short side 10b of an insulating circuit substrate 10 is located) in such a manner that the longitudinal direction thereof coincides with the X-direction. Each second conductive plate 12b is formed into a solid pattern of which the plan-view shape is, for example, a rectangle and is arranged at a position biased toward the side on which one short side of the two short sides of an insulating plate 11 is located (the side on which one short side 10a of an insulating circuit substrate 10 is located) in such a manner that the longitudinal direction thereof coincides with the Y-direction. Each first conductive plate 12a and a corresponding second conductive plate 12b are formed in such a manner that the first conductive plate 12a has an area several times larger than that of the second conductive plate 12b and are separated from each other in an insulating manner.

Figure 2:
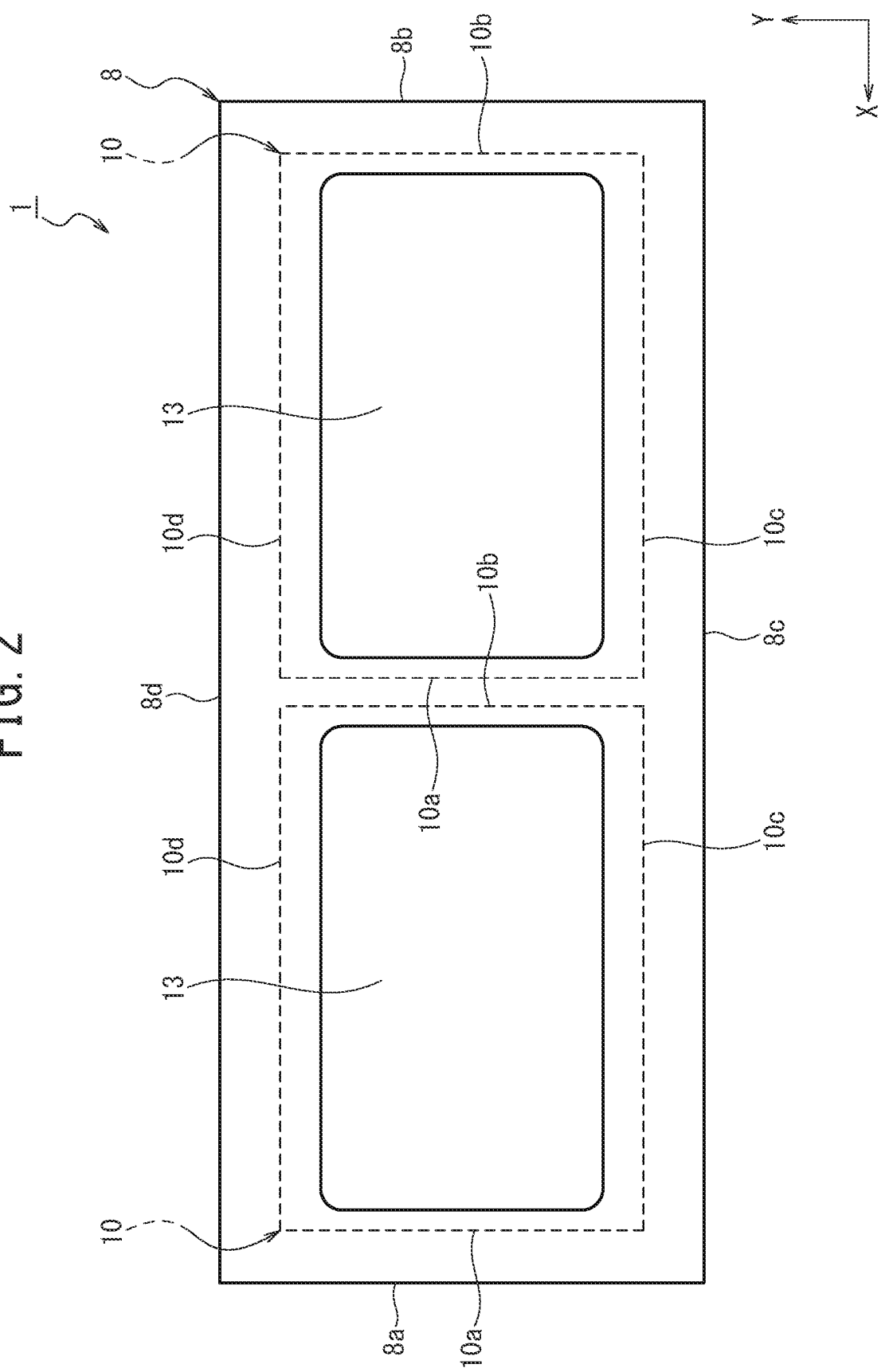
FIG. 2 is a schematic bottom view illustrative of the example of the external appearance configuration of the semiconductor device according to the first embodiment of the invention.

As illustrated in FIGS. 2 and 4A and 4B, each heat radiation plate 13 is formed into a solid pattern of which the plan-view shape is, for example, a rectangle, and is arranged on the inner side of the four sides of an insulating plate in such a manner that the longitudinal direction thereof coincides with the X-direction. In the first embodiment, the front surface of each heat radiation plate 13 serves as the back surface of an insulating circuit substrate 10, and the front surface of the heat radiation plate 13 (the back surface of the insulating circuit substrate 10) is exposed from the back surface of the resin sealing body 8 on the opposite side to the principal surface thereof.

As illustrated in FIG. 3, for example, four semiconductor chips 3, although the number is not limited to four, are arranged on each of the two insulating circuit substrates 10. Two semiconductor chips 3 among the four semiconductor chips 3 are arranged on the one short side 10a side of the insulating circuit substrate 10 along the one short side 10a with a predetermined gap interposed therebetween. The other two semiconductor chips 3 are arranged on the other short side 10b side of the insulating circuit substrate 10 along the other short side 10b with a predetermined gap interposed therebetween. That is, the semiconductor chips 3 are arranged on the respective sides on which the two short sides of the insulating circuit substrate 10, which are located on the opposite sides to each other in the longitudinal direction thereof, are located.

On each semiconductor chip 3, a transistor element is mounted. By connecting in parallel the transistor elements of the respective ones of the four semiconductor chips 3 mounted on each insulating circuit substrate 10, a switching element is constituted. As each transistor element, a vertical semiconductor element, such as a MIS transistor and an IGBT, that has an insulated gate structure and in which main current flows in the depth direction of the semiconductor chip 3 is suitable. Hereinafter, description will be made using, as a transistor element, a vertical MISFET that has an insulated gate structure and is constituted on the basis of a semiconductor substrate made of silicon carbide (SiC).

Note that the MIS transistor is a concept including a MISFET, MISSIT, and the like. While a MOS transistor is a transistor in which a silicon oxide ($SiO_2$) film is used as a gate insulating film, the "MIS transistor" means a more inclusive insulated gate type transistor in which an insulating film other than a $SiO_2$ film is used as a gate insulating film.

As illustrated in FIGS. 3 and 4A and 4B, each semiconductor chip 3 includes, for example, a source electrode 3s as a second main electrode and a gate electrode 3g as a control electrode on the principal surface, which is one surface of two surfaces located on the opposite sides to each other of the semiconductor chip 3, and a drain electrode 3d as a first main electrode on the back surface, which is the other surface of the two surfaces.

As illustrated in FIGS. 4A and 4B, the semiconductor chips 3 have the drain electrodes 3d thereof fixed to and electrically and mechanically connected to the first conductive plate 12a with solder 15 as a joining material interposed therebetween on each of the two insulating circuit substrates 10. Four semiconductor chips 3 are mounted on the principal surface of each of the two insulating circuit substrates 10 with the drain electrodes 3d thereof connected in parallel to one another.

As illustrated in FIGS. 4A and 4B, the wiring substrate 20 is arranged facing the principal surface (chip mounting surface) side of the respective ones of the two insulating circuit substrates 10, separated from the semiconductor chips 3. The wiring substrate 20 is supported to the respective ones of the two insulating circuit substrates 10 by way of the plurality of conductive posts 5.

As illustrated in FIGS. 1 and 3, the wiring substrate 20 has a plan-view shape of, for example, a rectangle and has one short side 20a and the other short side 20b that are located on the opposite sides to each other in the longitudinal direction, which is in the X-direction, and one long side 20c and the other long side 20d that are located on the opposite sides to each other in the short-side direction, which is in the Y-direction. The wiring substrate 20 is arranged in such a manner that the extending direction of the two short sides 20a and 20b coincides with the extending direction of the two short sides 8a and 8b of the resin sealing body 8 and the extending direction of the two long sides 20c and 20d also coincides with the extending direction of the two long sides 8c and 8d of the resin sealing body 8.

The wiring substrate 20 is a regular printed wiring substrate and has, for example, a two-layer wiring structure, although not limited thereto. Specifically, as illustrated in FIGS. 4A and 4B, the wiring substrate 20 includes an insulating plate 21, conductive plates 22a that are disposed in a first wiring layer on the principal surface of the insulating plate 21, and gate wirings 23a that are disposed in a second wiring layer on the back surface of the insulating plate 21 on the opposite side to the principal surface thereof. Although not illustrated in detail, each conductive plate 22a is formed into a solid pattern of which the plan-view shape is, for example, a rectangle. The conductive plates 22a and the gate wirings 23a are respectively disposed corresponding to the two insulating circuit substrates 10.

The conductive plates 22a and the gate wirings 23a are formed of, for example, copper foil having a thickness of approximately 75 µm. The insulating plate 21 is formed of, for example, an insulating resin substrate that is produced by impregnating polyimide-based resin into glass fibers.

As illustrated in FIGS. 3 and 4A and 4B, the plurality of conductive posts 5 include first to third conductive post 5a, 5b, and 5c. The first to third conductive posts 5a, 5b, and 5c are disposed with respect to each of the two insulating circuit substrates 10.

As illustrated in FIGS. 4A and 4B, each first conductive post 5a has, on one of the two insulating circuit substrates 10, one end side electrically and mechanically connected to a source electrode 3s of a semiconductor chip 3 by means of, for example, solder 16 as a joining material and the other end side fixed to the wiring substrate 20, penetrating the wiring substrate 20 and also electrically and mechanically connected to a conductive plate 22a. That is, each first conductive post 5a has one end side fixed to an insulating circuit substrate 10 via a semiconductor chip 3 and the other end side fixed to the wiring substrate 20. Two first conductive posts 5a, although the number is not limited to two, are, for example, disposed on each semiconductor chip 3.

Each second conductive post 5b has, on one of the two insulating circuit substrates 10, one end side electrically and mechanically connected to the second conductive plate 12b of the insulating circuit substrate 10 by means of, for example, solder 16 as a joining material and the other end side fixed to the wiring substrate 20, penetrating the wiring substrate 20 and also electrically and mechanically connected to a conductive plate 22a. That is, each second conductive post 5b has one end side fixed to an insulating circuit substrate 10 and the other end side fixed to the wiring substrate 20. Two second conductive posts 5b, although the number is not limited to two, are, for example, disposed on each second conductive plate 12b.

Each third conductive post 5c has, on one of the two insulating circuit substrates 10, one end side electrically and mechanically connected to the gate electrode 3g of a semiconductor chip 3 by means of, for example, solder 16 as a joining material and the other end side fixed to the wiring substrate 20 in a piercing manner and also electrically and mechanically connected to a gate wiring 23a. That is, each third conductive post 5c has one end side fixed to an insulating circuit substrate 10 via a semiconductor chip 3 and the other end side fixed to the wiring substrate 20. One first conductive post 5c, although the number is not limited to one, is, for example, disposed on each semiconductor chip 3.

As illustrated in FIGS. 4A and 4B, the first main circuit terminals 7a, the second main circuit terminals 7b, and the control terminals 7c are respectively disposed with respect to each of the two insulating circuit substrates 10. Each of the first main circuit terminals 7a, the second main circuit terminals 7b, and the control terminals 7c is made of a conductive pin, is sealed by the resin sealing body 8 excluding a portion thereof, and has the portion projecting out of the resin sealing body 8. That is, each of the first main circuit terminals 7a, the second main circuit terminals 7b, and the control terminals 7c extends from the inside to the outside of the resin sealing body 8 in the thickness direction (Z-direction) of the resin sealing body 8.

Each first main circuit terminal 7a has, on one of the two insulating circuit substrates 10, one end side electrically and mechanically connected to the first conductive plate 12a of the insulating circuit substrate 10 by means of, for example, solder 16 as a joining material, an intermediate portion penetrating a through-hole of the wiring substrate 20, and the other end side projecting out of the principal surface of the resin sealing body 8. Each second main circuit terminal 7b has, on one of the two insulating circuit substrates 10, one end side electrically and mechanically connected to the second conductive plate 12b of the insulating circuit substrate 10 by means of, for example, solder 16 as a joining material, an intermediate portion penetrating a through-hole of the wiring substrate 20, and the other end side projecting out of the principal surface of the resin sealing body 8.

That is, each first main circuit terminal 7a is electrically connected to the drain electrodes 3d of semiconductor chips 3 by way of solder 16, the first conductive plate 12a of an insulating circuit substrate 10, and solder 15. The source electrodes 3s of each semiconductor chip 3 are electrically connected to a second main circuit terminal 7b by way of solder 16, first conductive posts 5a, a conductive plate 22a of the wiring substrate 20, a second conductive post 5b, solder 16, the second conductive plate 12b of an insulating circuit substrate 10, and solder 16. Two first main circuit terminals 7a and two second main circuit terminals 7b, although the number is not limited to two, are, for example, disposed on each of the two insulating circuit substrate 10.

Each control terminal 7c has, on one of the two insulating circuit substrates 10, one end side penetrating the wiring substrate 20 from the principal surface side of the wiring substrate 20 and the other end side projecting out of the principal surface of the resin sealing body 8. That is, each control terminal 7c is electrically connected to the gate electrodes 3g of semiconductor chips 3 by way of a gate wiring 23a of the wiring substrate 20, third conductive posts 5c, and solder 16. Two control terminals 7c, although the number is not limited to two, are, for example, disposed on each of the two insulating circuit substrate 10.

As illustrated in FIG. 4B, each conductive plate 22a of the wiring substrate 20 has, in order to prevent a short-circuit with control terminals 7c, opening portions $22a_1$ the diameter of each of which is greater than the diameter of each control terminal 7c at portions at which the control terminals 7c penetrate, and the sidewalls of the conductive plate 22a in the opening portions $22a_1$ are separated from the control terminals 7c.

As illustrated in FIGS. 4A, 4B, 5 to 8, each of the plurality of conductive posts 5 (5a, 5b, and 5c) has a recessed portion 6 that is recessed from the outer peripheral surface toward the inner side. As illustrated in FIGS. 5 to 8, each conductive post 5 includes a first portion $5p_1$ that includes a recessed portion 6, a second portion $5p_2$ one end side of which is joined to the first portion $5p_1$ and the other end side of which is fixed to an insulating circuit substrate 10, and a third portion $5p_3$ one end side of which is joined to the first portion $5p_1$ and the other end side of which is fixed to the wiring substrate 20. The second portion $5p_2$ of each of the first and third conductive posts 5a and 5c is fixed to an insulating circuit substrate 10 via a semiconductor chip 3.

Each recessed portion 6 is, for example, formed in an annular shape along the circumference direction of a conductive post 5. The first portion $5p_1$ including the recessed portion 6 has a cross-section orthogonal to the longitudinal direction (Z-direction) of the conductive post 5 having an area less than those of the second and third portions $5p_2$ and $5p_3$. For this reason, the first portion $5p_1$ has a mechanical strength less than those of the second and third portions $5p_2$ and $5p_3$ and is thus likely to be deformed. That is, each conductive post 5 is configured such that the first portion $5p_1$ is selectively deformed by shear stress generated by relative displacement between the insulating circuit substrates 10 and the wiring substrate 20.

Each recessed portion 6 is, for example, arranged in one stage in the longitudinal direction of the conductive post 5. That is, each conductive post 5 of the first embodiment has a structure in which the first portion $5p_1$ including the recessed portion 6 is sandwiched between the second portion $5p_2$ and the third portion $5p_3$.

The recessed portion 6 of each of the first and third conductive posts 5a and 5c is arranged at a position on the wiring substrate 20 side of a middle point $M_1$ of a distance L1 between a semiconductor chip 3 and the wiring substrate 20, in other words, at a position closer to the wiring substrate 20 side than to the semiconductor chip 3 side. The recessed portion 6 of each of the second conductive posts 5b is also arranged at a position on the wiring substrate 20 side of a middle point $M_2$ (see FIGS. 5 and 6) of a distance L2 between an insulating circuit substrate 10 and the wiring substrate 20, in other words, at a position closer to the wiring substrate 20 side than to the insulating circuit substrate 10 side. Each recessed portion 6 has, for example, a cross-sectional shape along the longitudinal direction of the conductive post 5 formed into a rectangle.

As illustrated in FIGS. 5 to 8, each of the conductive posts 5 (5a, 5b, and 5c) has the central axis in the longitudinal direction of the second portion $5p_2$ offset from the central axis in the longitudinal direction of the third portion $5p_3$ due to deformation (bending) of the first portion $5p_1$. The amount of the offset increases as it comes closer to the two short sides 20a and 20b of the wiring substrate 20 from the middle point Mp in the longitudinal direction of the wiring substrate 20. That is, the amount of the offset is greater on the sides on which the short sides 20a and 20b of the wiring substrate 20 are located than around the middle point Mp of the wiring substrate 20. With the middle point Mp of the wiring substrate 20 as a boundary, a direction of offset on the one short side 20a side (see FIGS. 5 and 7) and a direction of offset on the other short side 20b side (see FIGS. 6 and 8) are opposite to each other. The deformation of the first portions $5p_1$ of the conductive posts 5 is illustrated using as an example a case where, in a reflow step in a manufacturing process of the semiconductor device 1, which will be described later, the first portions $5p_1$ are deformed by shear stress due to relative displacement between the insulating circuit substrates 10 and the wiring substrate 20.

<Method for Manufacturing Semiconductor Device>

Next, a method for manufacturing the semiconductor device 1 according to the first embodiment of the invention will be described using FIGS. 9A, 9B, 10A, 10B, 11A, 11B, 12 to 14. Note that, in FIGS. 9A, 9B, 10A, 10B, 11A, 11B, 12 to 14, illustration of conductive paths including the gate electrodes 3g of the semiconductor chips 3, the third conductive posts 5c, the gate wirings 23a, and the control terminals 7c is omitted.

First, two insulating circuit substrates 10 illustrated in FIG. 9A and a wiring substrate 20 illustrated in FIG. 9B are prepared. As illustrated in FIG. 9B, the wiring substrate 20 includes first conductive posts 5a and second conductive posts 5b and, although not illustrated, third conductive posts 5c and control terminals 7c, which are electrically and mechanically connected to predetermined positions in advance.

Next, the respective ones of the two insulating circuit substrates 10 are arranged with a predetermined gap interposed therebetween in the longitudinal direction (X-direction) thereof in such a manner that the other short side 10b of two short sides 10a and 10b of one insulating circuit substrate 10 and one short side 10a of the two short sides 10a and 10b of the other insulating circuit substrate 10 face each other, as illustrated in FIGS. 9A and 9B.

Next, on each of the two insulating circuit substrates 10, for example, solder paste material 15a is applied as a joining material on chip mounting regions of a first conductive plate 12a. As illustrated in FIG. 10A, semiconductor chips 3 are arranged on the chip mounting regions of the first conductive plates 12a with the solder paste material 15a interposed therebetween. Each semiconductor chip 3 is arranged in such a manner that the drain electrode 3d on the back surface faces the solder paste material 15a side.

Next, as illustrated in FIG. 10B, on each of the two insulating circuit substrates 10, for example, solder paste material 16a is applied as a joining material on the respective ones of terminal connection regions of the first conductive plate 12a and terminal connection regions and post connection regions of a second conductive plate 12b, and solder paste material 16a is also applied on source electrodes 3s and the gate electrodes 3g (not illustrated) of the semiconductor chips 3.

Next, as illustrated in FIG. 11A, the wiring substrate 20 is arranged above the two insulating circuit substrates 10 in such a manner that the first to third conductive posts 5a to 5c are located on the insulating circuit substrate 10 side. In this step, the wiring substrate 20 is supported to the two insulating circuit substrates 10 by the first to third conductive posts 5a to 5c, separated from the two insulating circuit substrate 10. One end side of each first conductive post 5a is arranged on a source electrode 3s of a semiconductor chip 3 with solder paste material 16a interposed therebetween, one end side of each second conductive post 5b is arranged on the second conductive plate 12b of an insulating circuit substrate 10 with solder paste material 16a interposed therebetween, and, although not illustrated, one end side of each third conductive post 5c is arranged on the gate electrode 3g of a semiconductor chip 3 with solder paste material 16a interposed therebetween.

Next, first main circuit terminals 7a and second main circuit terminals 7b are inserted into predetermined through-holes of the wiring substrate 20 and held vertically. In this step, as illustrated in FIG. 11B, one end side of each first main circuit terminal 7a is arranged on the first conductive plate 12a of an insulating circuit substrate 10 with solder paste material 16a interposed therebetween, and one end side of each second main circuit terminal 7b is placed on the second conductive plate 12b of an insulating circuit substrate 10 with solder paste material 16a interposed therebetween.

Next, by performing reflow processing while the semiconductor device 1 is in a state illustrated in FIG. 11B, the drain electrodes 3d of the semiconductor chips 3 are respectively electrically and mechanically connected to the first conductive plates 12a of the insulating circuit substrates 10 by means of solder 15, as illustrated in FIG. 12A. In addition, one end sides of the first main circuit terminals 7a are electrically and mechanically connected to the first conductive plates 12a of the insulating circuit substrates 10 by means of solder 16, and one end sides of the second main circuit terminals 7b and one end sides of the second conductive posts 5b are respectively electrically and mechanically connected to the second conductive plates 12b of the insulating circuit substrates 10 by means of solder 16. Further, one end sides of the first conductive posts 5a and one end sides of the third conductive posts 5c are electrically and mechanically connected to the source electrodes 3s and gate electrodes 3g of the semiconductor chips 3 by means of solder 16, respectively. This processing causes a substrate stack 2 in which the wiring substrate 20 is supported to the respective ones of the two insulating circuit substrates 10 to be formed. In addition, the semiconductor chips 3 are mounted on the first conductive plates 12a of the respective ones of the two insulating circuit substrates 10.

Figure 13:
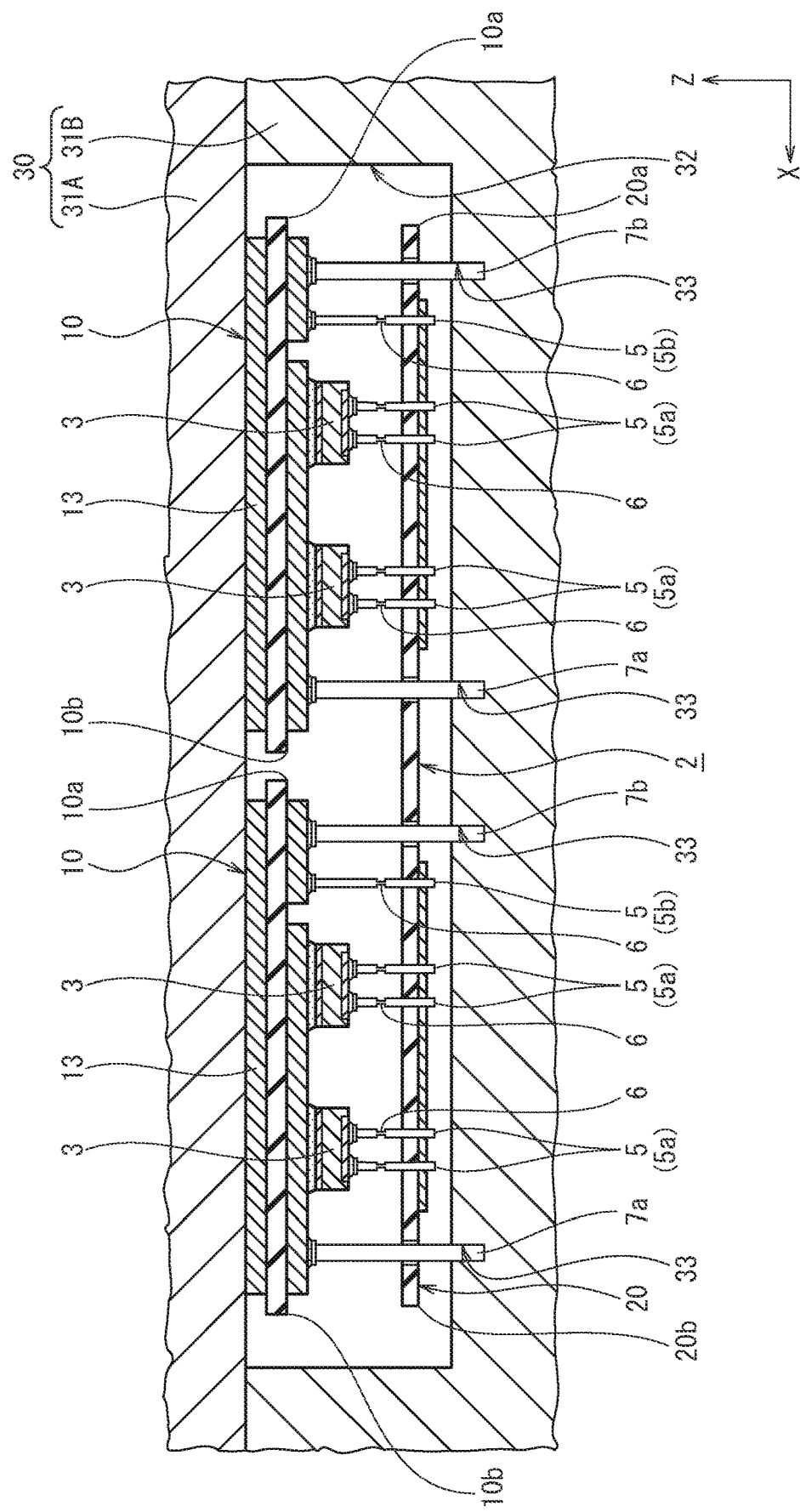
FIG. 13 is still another schematic cross-sectional view for a description of the method for manufacturing the semiconductor device according to the first embodiment of the invention.

Next, as illustrated in FIG. 13, the substrate stack 2 is arranged in a cavity 32 formed by an upper die 31A and a lower die 31B of a molding die 30 and clamped by the molding die 30. In this step, the substrate stack 2 is arranged inside the cavity 32 with the back surfaces (heat radiation plates 13) of the respective ones of the two insulating circuit substrates 10 in pressure contact with a wall surface of the cavity 32 by clamping force of the molding die 30. The substrate stack 2 is also arranged inside the cavity 32 with the other end sides of the respective ones of the first main circuit terminals 7a, the second main circuit terminals 7b, and the control terminals 7c inserted into recessed portions 33 formed on another wall surface of the cavity 32 of the molding die 30.

Figure 14:
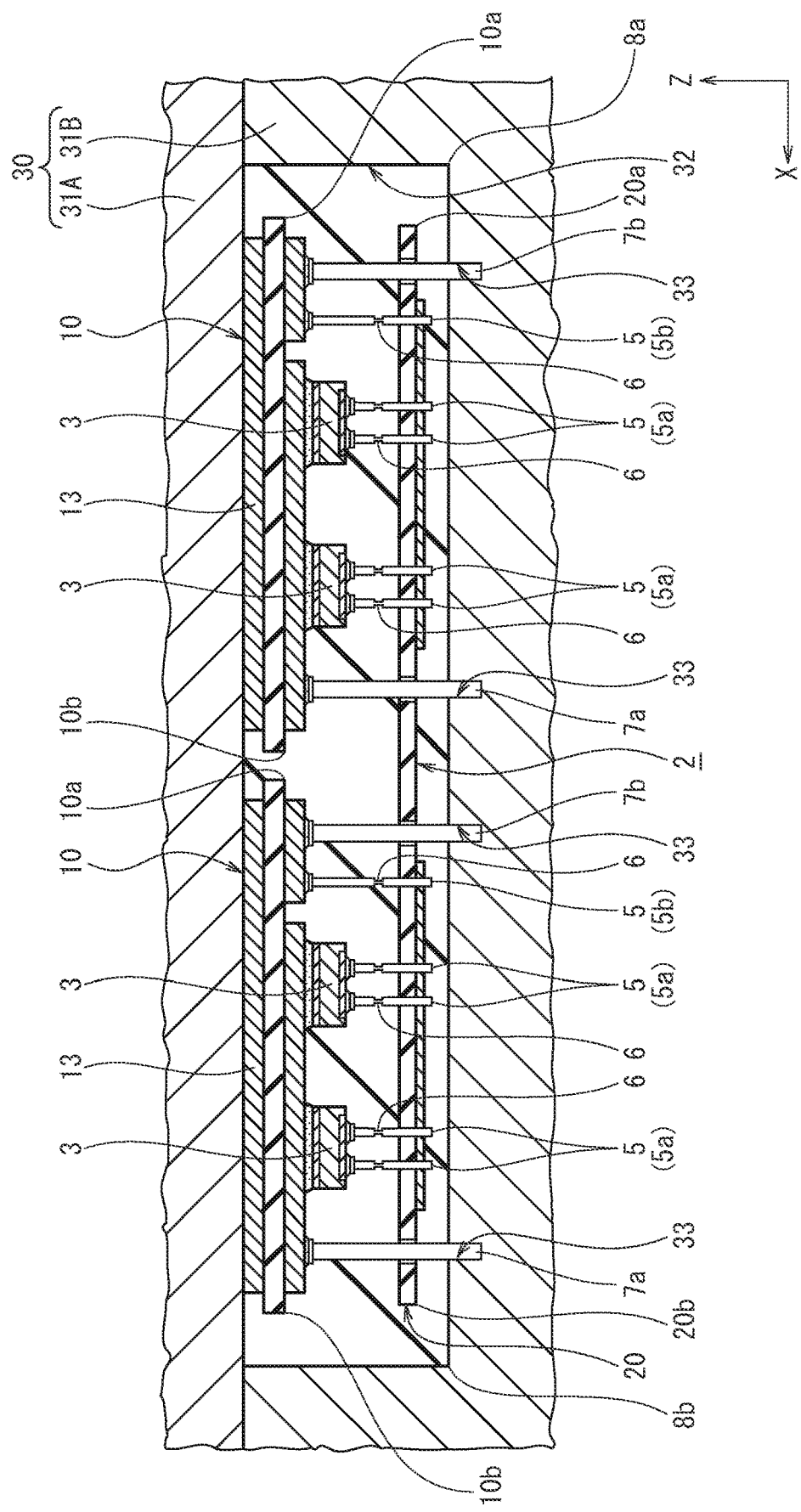
FIG. 14 is still another schematic cross-sectional view for a description of the method for manufacturing the semiconductor device according to the first embodiment of the invention.

Next, by pressure injecting, for example, epoxy-based thermosetting resin into the inside of the cavity 32 of the molding die 30 while the semiconductor device 1 is in a state illustrated in FIG. 13, a resin sealing body 8 is molded, as illustrated in FIG. 14. In this step, the resin sealing body 8 in which the substrate stack 2 is sealed with the other end sides of the respective ones of the first main circuit terminals 7a, the second main circuit terminals 7b, and the control terminals 7c projecting out of the principal surface thereof and the back surfaces (heat radiation plates 13) of the respective ones of the two insulating circuit substrates 10 exposed from the back surface thereof is formed.

Next, after the resin sealing body 8 is taken out of the molding die 30, resin burrs attached to the back surfaces of the respective ones of the two insulating circuit substrates 10, that is, the front surfaces of the heat radiation plates 13 are removed by grinding or the like. By subsequently performing an inspection step, a marking step, and the like, the semiconductor device 1 according to the first embodiment is almost completed.

Advantageous Effects of First Embodiment

Next, main advantageous effects of the first embodiment will be described with reference to FIG. 15, which illustrates a prior art semiconductor device. Although, in FIG. 15, the same signs as those in FIGS. 4A and 4B are used, a conventional substrate stack 50 illustrated in FIG. 15 has a configuration in which no recessed portion 6 is disposed on conductive posts 5 (5a, 5b, and 5c).

Figure 15:
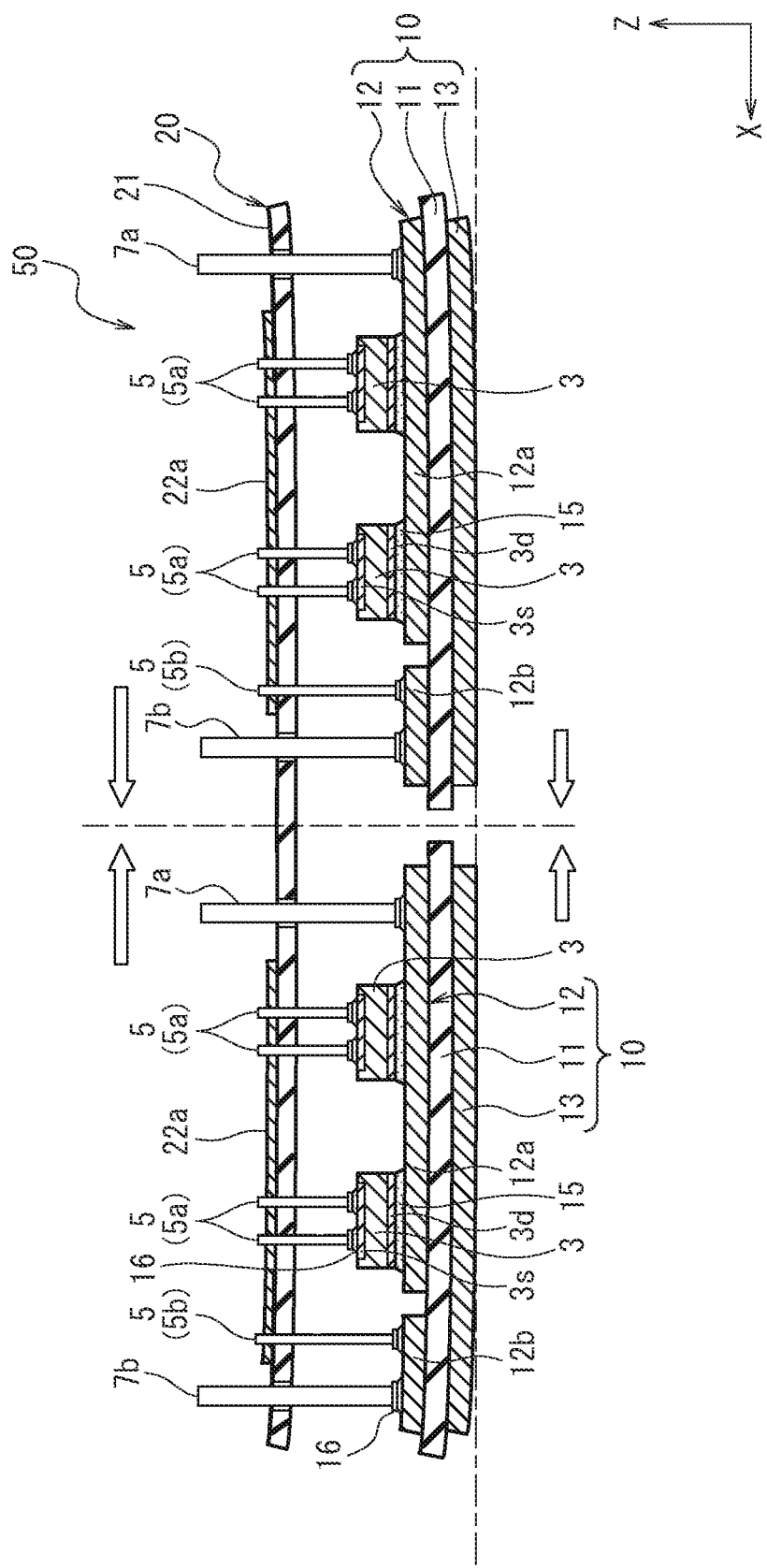
FIG. 15 is a schematic cross-sectional view illustrative of a positive warp state of the back surfaces of insulating circuit substrates in a conventional substrate stack.

As illustrated in FIG. 15, the conventional substrate stack 50 sometimes warps greatly in a direction in which the back surfaces of insulating circuit substrates 10 protrude to form a protruding surface. It is considered that this is because, since a heating furnace is used in the above-described reflow step illustrated in FIG. 12, a difference in linear expansion coefficients between the insulating circuit substrates 10 and a wiring substrate 20 has an influence. That is, in an early stage of cooling after heating, thermal stress is small across the insulating circuit substrates 10 and the wiring substrate 20. Since copper (Cu) metal layers (conductive plates 12 and heat radiation plates 13) of the insulating circuit substrates 10 are in an elastic region and tend to contract, the warp becomes a warp (negative warp) in a direction in which the back surfaces of the insulating circuit substrates 10 is recessed to form a recessed surface. However, when, in a later stage of cooling, the temperature decreases to, for example, 25° C., the copper metal layers of the insulating circuit substrates 10 enter into a plastic region and an increase rate of contraction decreases and, at the same time, contraction of the wiring substrate 20 by a polyimide resin layer (insulating plate 21) increases. For this reason, the insulating circuit substrates 10 are deformed by shear stress due to relative displacement between the insulating circuit substrates 10 and the wiring substrate 20, and the deformation leads to a warp in a direction in which the back surfaces of the insulating circuit substrates 10 protrudes to form a protruding surface.

On the other hand, the semiconductor device 1 according to the first embodiment includes the conductive posts 5 on each of which a recessed portion 6 that is recessed from the outer peripheral surface toward the inner side is disposed, as illustrated in FIGS. 4A, 4B, 5 to 8. In each of the conductive posts 5, the first portion $5p_1$ including the recessed portion 6 has a mechanical strength less than those of the second and third portions $5p_2$ and $5p_3$ and is thus likely to be deformed. For this reason, in the reflow step illustrated in FIG. 12, the first portion $5p_1$ of each conductive post 5 is selectively deformed by shear stress due to relative displacement between the insulating circuit substrates 10 and the wiring substrate 20 when the polyimide resin layer of the wiring substrate 20 contracts in a later stage of cooling, and the deformation enables a warp (positive warp) in a direction in which the back surfaces of the insulating circuit substrates 10 protrudes to form a protruding surface to be reduced.

The positive warp of the back surfaces of the insulating circuit substrates 10 influences thickness of resin burrs that are attached to the back surface of the insulating circuit substrates 10 in the above-described resin sealing step illustrated in FIG. 14. Thick resin burrs make it difficult to remove the resin burrs by means of grinding or the like, which causes an assembly failure. Such an assembly failure means a reduction in manufacturing yield of semiconductor devices. Since the semiconductor device 1 of the first embodiment is, as described above, capable of reducing a positive warp of the insulating circuit substrates 10 by means of deformation of the first portion $5p_1$ of each conductive post 5, resin burrs attached to the back surfaces of the insulating circuit substrates 10 can be suppressed or thickness of such resin burrs can be reduced in the resin sealing step illustrated in FIG. 14.

Therefore, the semiconductor device 1 according to the first embodiment enables improvement in productivity, that is, improvement in manufacturing yield, to be achieved.

Since deepening the recessed portion 6 of the first portion $5p_1$ of each conductive post 5 causes the diameter thereof to be small and thereby enables the mechanical strength thereof to be reduced, the first portion $5p_1$ of the conductive post 5 becomes easily deformed. However, thinning the first portion $5p_1$ of each conductive post 5 causes a resistance value of the conductive post 5 to be increased. Therefore, it is preferable to set a depth of the recessed portion 6 of each conductive post 5 in consideration of a resistance value and ease of deformation of the conductive post 5.

In the first embodiment, recessed portions 6 are disposed to all the conductive posts 5. However, as described above, the amount of offset between the central axis in the longitudinal direction of the second portion $5p_2$ of a conductive post 5 and the central axis in the longitudinal direction of the third portion $5p_3$ thereof generated by deformation (bending) of the first portion $5p_1$ thereof increases as it comes closer to the two short sides 20a and 20b of the wiring substrate 20 from the middle point Mp in the longitudinal direction of the wiring substrate 20. Therefore, it is not necessary to dispose recessed portions 6 to all the conductive posts 5, and it is preferable to dispose recessed portions 6 to at least conductive posts 5 located on the two short sides 20a and 20b sides in the longitudinal direction of the wiring substrate 20.

One end side of each of the conductive posts 5 is electrically and mechanically connected to one of the electrodes (source electrodes 3s and gate electrodes 3g) of the semiconductor chips 3 or one of the second conductive plates 12b of the insulating circuit substrates 10 by means of solder 16. Since connection using solder 16 is performed by melting solder paste material 16a, there is a possibility that melted solder wets and spreads in the longitudinal direction of a conductive post 5 and a solder reservoir is generated in the recessed portion 6 thereof. Therefore, it is preferable to arrange the recessed portion 6 of each of the first and third conductive posts 5a and 5c at a position closer to the wiring substrate 20 side than to the semiconductor chip 3 side, lest a solder reservoir is generated in the recessed portion 6. In addition, it is preferable to arrange the recessed portion 6 of each of the second conductive posts 5b at a position closer to the wiring substrate 20 side than to the insulating circuit substrate 10 side.

Second Embodiment

A semiconductor device 1A according to a second embodiment of the invention has approximately the same configuration as that of the semiconductor device 1 according to the first embodiment described above and differs from the semiconductor device 1 in the following configuration.

Figure 16:
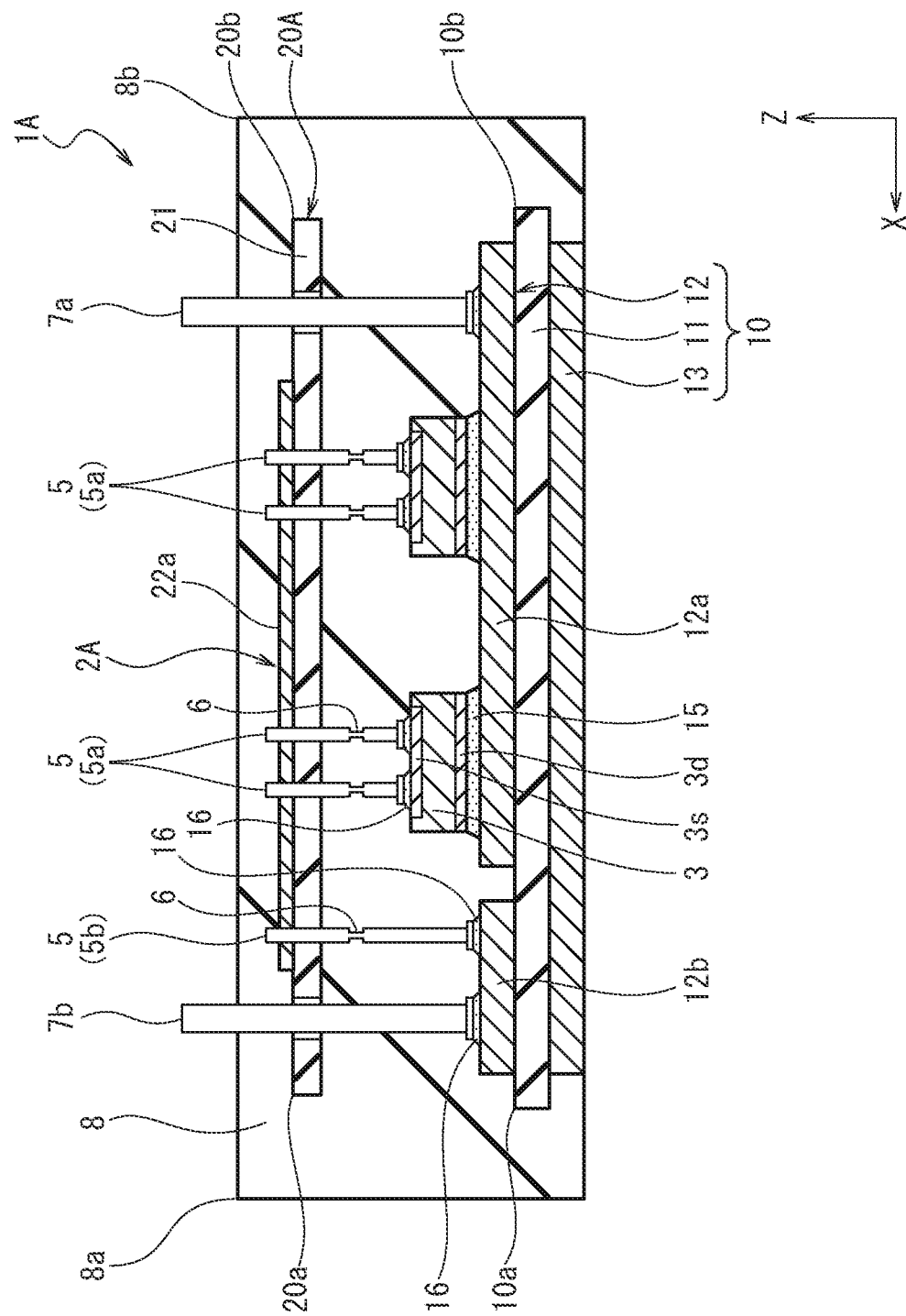
FIG. 16 is a schematic cross-sectional view illustrative of an example of an internal structure of a semiconductor device according to a second embodiment of the invention.

That is, as illustrated in FIG. 16, the semiconductor device 1A according to the second embodiment includes a substrate stack 2A in which a wiring substrate 20A is supported to an insulating circuit substrate 10 by way of conductive posts 5 and a resin sealing body 8 configured to seal the substrate stack 2A. The wiring substrate 20 of the first embodiment includes two identical sets of conductive patterns corresponding to the two insulating circuit substrates 10. On the other hand, the wiring substrate 20A of the second embodiment includes a set of conductive patterns that is the same as each set of conductive patterns of the wiring substrate 20 of the first embodiment, corresponding to one insulating circuit substrates 10.

Since the wiring substrate 20A of the second embodiment has a length in the longitudinal direction half of the length in the longitudinal direction of the wiring substrate 20 of the first embodiment, a positive warp of the back surface of the insulating circuit substrate 10 of the second embodiment is small. However, applying the invention to the semiconductor device 1A as described above also enables a first portion $5p_1$ of each conductive post 5 to be selectively deformed by shear stress due to relative displacement between the insulating circuit substrate 10 and the wiring substrate 20A and a warp (positive warp) in a direction in which the back surface of the insulating circuit substrate 10 protrudes to forma protruding surface to be reduced, in the reflow step illustrated in FIG. 12. Therefore, the semiconductor device 1A according to the second embodiment also enables improvement in manufacturing yield to be achieved.

(Variations)

Figure 17:
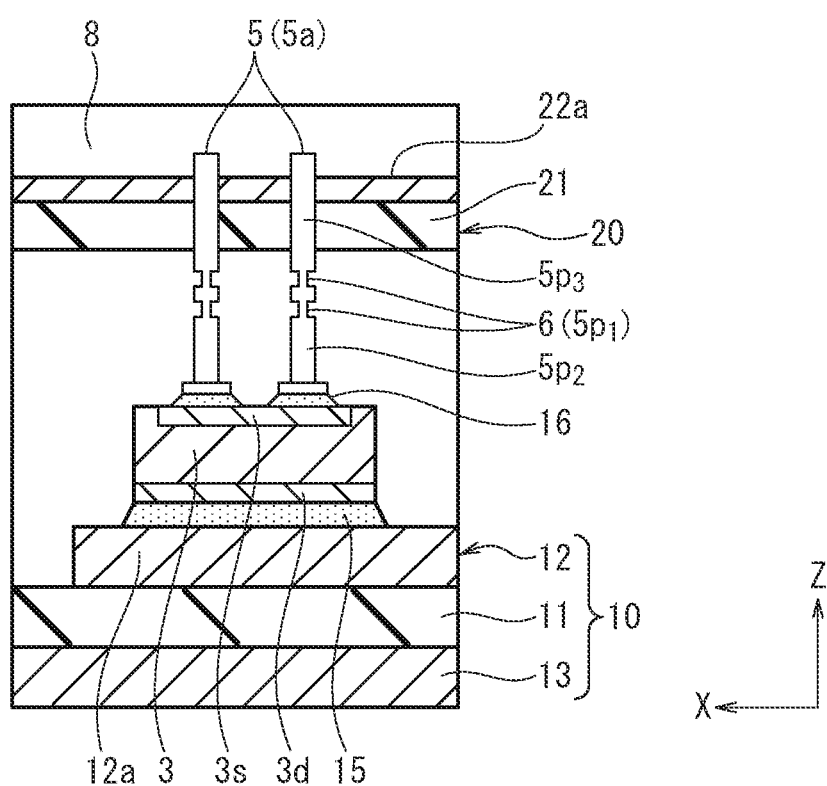
FIG. 17 is a main part schematic cross-sectional view illustrative of a variation of the embodiments of the invention.

In the first and second embodiments described above, a case where a recessed portion 6 is arranged in one stage in the longitudinal direction of each conductive post 5 was described. However, the invention is not limited to the one stage arrangement. For example, as a first variation, a recessed portion 6 may be arranged in two stages in the longitudinal direction of each conductive post 5 as illustrated in FIG. 17 or arranged in three or more stages.

Figure 18:
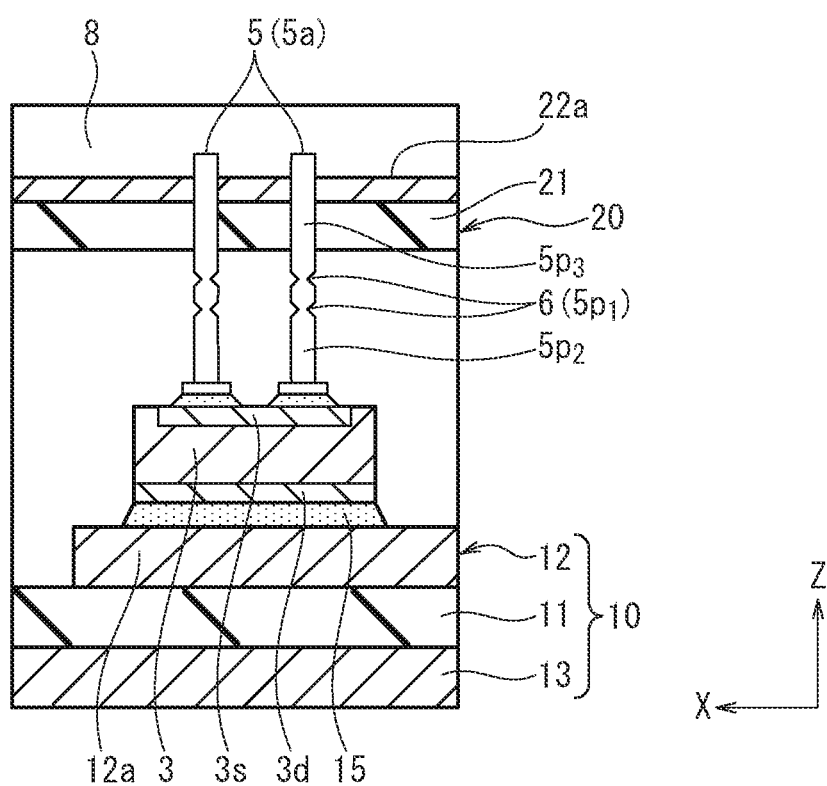
FIG. 18 is a main part schematic cross-sectional view illustrative of another variation of the embodiments of the invention.

In addition, in the first and second embodiments described above, a case where each recessed portion 6 is formed into a rectangular shape was described. However, the invention is not limited to the rectangular shape. For example, as a second variation, each recessed portion 6 may be formed into a wedge shape, as illustrated in FIG. 18.

Although the invention was described above specifically based on the above embodiments, the invention is not limited to the above embodiments and the variations thereof, and it is needless to say that various modifications may be made without departing from the scope of the invention.

For example, the semiconductor device according to the above-described embodiments was described focusing on a vertical MISFET as a transistor element mounted on a semiconductor chip. However, the invention is not limited to such a semiconductor device and can be applied to, for example, a semiconductor device including a semiconductor chip on which an IGBT is mounted as a transistor element.

The invention can also be applied to a semiconductor device including a semiconductor chip on which a transistor element is mounted and a semiconductor chip on which a rectifying element is mounted.

REFERENCE SIGNS LIST

1 Semiconductor device
2 Substrate stack
3 Semiconductor chip
3d Drain electrode
3g Gate electrode
3s Source electrode
5 Conductive post
5a First conductive post
5b Second conductive post
5c Third conductive post
$5p_1$ First portion
$5p_2$ Second portion
$5p_3$ Third portion
6 Recessed portion
7a First main circuit terminal
7b Second main circuit terminal
7c Control terminal
8 Resin sealing body
8a, 8b Short side
8c, 8d Long side
10 Insulating circuit substrate
10a, 10b Short side
10c, 10d Long side
11 Insulating plate
12 Conductive plate
12a First conductive plate
12b Second conductive plate
13 Heat radiation plate
15, 16 Solder
15a, 16a Solder paste material
20 Wiring substrate
20a, 20b Short side
20c, 20d Long side
21 Insulating plate
22a Conductive plate
$22a_1$ Opening portion
23a Gate wiring
30 Molding die
31A Upper die
31B Lower die
32 Cavity
33 Recessed portion

The invention claimed is:

1. A semiconductor device comprising:
an insulating circuit substrate including a principal surface and a back surface located on opposite sides to each other and having a plan-view shape of a rectangle;
semiconductor chips each of which includes an electrode on a principal surface and has a back surface on an opposite side to the principal surface, the back surface being fixed to the principal surface of the insulating circuit substrate;
a wiring substrate arranged facing the principal surface side of the insulating circuit substrate, separated from the semiconductor chip;
a conductive post including a first portion, a second portion having one end side joined to the first portion and another end side fixed to the electrode of the semiconductor chips via a joining material, and a third portion having one end side joined to the first portion and another end side fixed to the wiring substrate, the first portion including a recessed portion deformed such that a central axis in a longitudinal direction of the second portion is offset from a central axis in a longitudinal direction of the third portion; and
a resin sealing body configured to seal the principal surface of the insulating circuit substrate, the semiconductor chips, the wiring substrate, and the conductive post,
wherein the semiconductor chips are respectively arranged on sides on which two sides located on opposite sides to each other in a longitudinal direction of the insulating circuit substrate are located.

2. The semiconductor device according to claim 1, wherein
the recessed portion is formed in an annular shape along a circumference direction of the conductive post.

3. The semiconductor device according to claim 1, wherein
the recessed portion is arranged in a plurality of stages in a longitudinal direction of the conductive post.

4. The semiconductor device according to claim 1, wherein
the recessed portion is arranged at a position closer to a side on which the wiring substrate is located than to a side on which the semiconductor chips are located.

5. The semiconductor device according to claim 1, wherein
two or more insulating circuit substrates are arranged in a longitudinal direction, and
the wiring substrate is arranged facing the principal surface of each of the two or more insulating circuit substrates and is supported to each of the two or more insulating circuit substrates by way of the conductive post.

6. The semiconductor device according to claim 1, wherein
the insulating circuit substrate includes an insulating plate, a conductor disposed on a principal surface side of the insulating plate and to which the back surfaces of the semiconductor chips are fixed, and a heat radiation plate disposed on an opposite side to the principal surface of the insulating plate and one surface of which is exposed from the resin sealing body.

7. The semiconductor device according claim 1, wherein the resin sealing body is made of thermosetting resin.

* * * * *